(12) United States Patent
Makiyama et al.

(10) Patent No.: US 10,804,358 B2
(45) Date of Patent: Oct. 13, 2020

(54) COMPOUND SEMICONDUCTOR DEVICE AND METHOD WITH HIGH CONCENTRATION DOPANT LAYER IN REGROWN COMPOUND SEMICONDUCTOR

(71) Applicant: FUJITSU LIMITED, Kawasaki-shi, Kanagawa (JP)

(72) Inventors: Kozo Makiyama, Kawasaki (JP); Yuichi Minoura, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 118 days.

(21) Appl. No.: 16/193,796

(22) Filed: Nov. 16, 2018

(65) Prior Publication Data

US 2019/0189746 A1    Jun. 20, 2019

(30) Foreign Application Priority Data

Dec. 20, 2017   (JP) ................. 2017-244455

(51) Int. Cl.
*H01L 29/08* (2006.01)
*H01L 21/02* (2006.01)
*H01L 21/225* (2006.01)
*H01L 29/66* (2006.01)
*H01L 21/285* (2006.01)
(Continued)

(52) U.S. Cl.
CPC .... *H01L 29/0891* (2013.01); *H01L 21/02576* (2013.01); *H01L 21/02631* (2013.01); *H01L 21/02639* (2013.01); *H01L 21/2258* (2013.01); *H01L 21/28581* (2013.01); *H01L 29/0847* (2013.01); *H01L 29/66462* (2013.01); *H01L 29/7786* (2013.01); *H01L 29/7787* (2013.01); *H01L 21/0254* (2013.01); *H01L 21/0262* (2013.01); *H01L 21/3065* (2013.01); *H01L 21/3081* (2013.01); *H01L 21/3086* (2013.01); *H01L 21/31111* (2013.01);
(Continued)

(58) Field of Classification Search
CPC ............... H01L 29/778; H01L 29/7781; H01L 29/7782; H01L 29/7783; H01L 29/7784; H01L 29/7785; H01L 29/7786; H01L 29/7787; H01L 29/66462; H01L 29/0891; H01L 29/66431; H01L 29/41; H01L 29/0843; H01L 29/0847
See application file for complete search history.

(56) References Cited

U.S. PATENT DOCUMENTS

2013/0105811 A1* 5/2013 Ando ................. H01L 29/2003 257/76
2014/0014966 A1 1/2014 Tabatabaie et al.
(Continued)

FOREIGN PATENT DOCUMENTS

| JP | 2015-523733 | 8/2015 |
|---|---|---|
| JP | 2016-115931 | 6/2016 |
| WO | 2014/011332 | 1/2014 |

*Primary Examiner* — John P. Dulka
(74) *Attorney, Agent, or Firm* — Fujitsu Patent Center

(57) ABSTRACT

A compound semiconductor device includes: a compound semiconductor area in which a compound semiconductor plug is embedded and formed; and an ohmic electrode provided on the compound semiconductor plug, wherein the compound semiconductor plug includes, in a side surface portion that is as an interface with the compound semiconductor area, a high concentration dopant layer containing a dopant whose concentration is higher than that of other portions.

18 Claims, 19 Drawing Sheets

(51) Int. Cl.
  *H01L 29/778* (2006.01)
  *H01L 29/20* (2006.01)
  *H01L 21/3065* (2006.01)
  *H01L 21/308* (2006.01)
  *H01L 21/311* (2006.01)
  *H01L 29/423* (2006.01)
  *H01L 29/207* (2006.01)

(52) U.S. Cl.
  CPC ........ *H01L 29/2003* (2013.01); *H01L 29/207* (2013.01); *H01L 29/42376* (2013.01)

(56) References Cited

U.S. PATENT DOCUMENTS

2016/0172473 A1    6/2016  Suzuki et al.
2017/0077283 A1*   3/2017  Nakata ................ H01L 29/7787

* cited by examiner

COMPOUND SEMICONDUCTOR DEVICE AND METHOD WITH HIGH CONCENTRATION DOPANT LAYER IN REGROWN COMPOUND SEMICONDUCTOR

CROSS-REFERENCE TO RELATED APPLICATION

This application is based on and claims priority to Japanese Patent Application No. 2017-244455 filed on Dec. 20, 2017, the entire contents of which are incorporated herein by reference.

FIELD

The embodiments discussed herein relate to a compound semiconductor device and a method for producing the compound semiconductor device.

BACKGROUND

With respect to semiconductor devices using compound semiconductors, there are many reports on field effect transistors, particularly high electron mobility transistors (HEMTs). For example, for a GaN-based HEMT, an AlGaN HEMT using GaN as an electron transit layer and AlGaN as an electron supply layer attracts attention. In an AlGaN HEMT, due to a lattice constant difference between GaN and AlGaN, distortion occurs in AlGaN. Thereby, due to piezo polarization and spontaneous polarization of AlGaN, a high concentration two-dimensional electron gas (2 DEG) can be obtained. Therefore, an AlGaN HEMT is expected as a high-efficiency switching device of a power amplifier for wireless communication and a high withstand voltage power device such as for an electric vehicle.

RELATED-ART DOCUMENTS

Patent Documents

[Patent Document 1] Japanese Laid-open Patent Publication No. 2016-115931
[Patent Document 2] Japanese Translation of PCT International Application No. 2015-523733

However, in a compound semiconductor device such as an AlGaN HEMT, the contact resistance of an ohmic electrode (ohmic contact resistance), such as a source electrode or a drain electrode, with a compound semiconductor area is high. In order to reduce this ohmic contact resistance, a method is devised in which a low energy barrier material such as n-GaN or n-InGaN is selectively regrown at a portion of a compound semiconductor area where an ohmic electrode is formed to form a compound semiconductor plug.

However, upon forming a compound semiconductor plug, it is inevitable two-dimensional electron gas and the compound semiconductor plug are essentially point-connected. At an interface between the compound semiconductor area and the compound semiconductor plug, a carrier (electron) concentration lowering area is generated due to airborne contaminants and bonding defects. Thus, there is a problem that dependence on the structure of the compound semiconductor plug is caused. As an example of this dependence on the structure, there is fluctuation in the maximum drain current due to a difference in depth at which the compound semiconductor plug is formed. Due to this fluctuation of the maximum drain current, device electrical characteristics are non-uniform.

SUMMARY

According to an aspect of the embodiments, a compound semiconductor device includes: a compound semiconductor area in which a compound semiconductor plug is embedded and formed; and an ohmic electrode provided on the compound semiconductor plug, wherein the compound semiconductor plug includes, in a side surface portion that is as an interface with the compound semiconductor area, a high concentration dopant layer containing a dopant whose concentration is higher than that of other portions.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENT

First Embodiment

An InAlGaN HEMT (High Electron Mobility Transistor) that is a nitride semiconductor will be described as a compound semiconductor device according to a first embodiment.

FIGS. 1 to 5 are schematic cross-sectional views sequentially illustrating steps of a method for producing an InAlGaN HEMT according to the first embodiment.

Figure 1A:
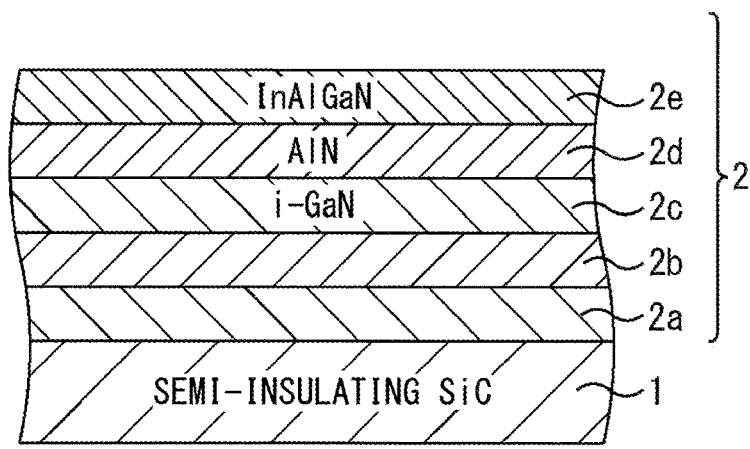
FIGS. 1A to 1C are schematic cross-sectional views sequentially illustrating steps of a method for producing an InAlGaN HEMT according to a first embodiment.

First, as illustrated by FIG. 1A, a compound semiconductor area 2 is formed on a SiC substrate 1 that is an example of a substrate for growth. As the substrate for growth, a Si substrate, a sapphire substrate, a GaN substrate, or the like may be used instead of the SiC substrate. Also, the substrate may have either a semi-insulating property or a conductive property.

The compound semiconductor area 2 is configured to include a nucleation layer 2a, a buffer layer 2b, an electron transit layer 2c, an intermediate layer 2d, and an electron supply layer 2e. In an InAlGaN HEMT, a two-dimensional electron gas (2 DEG) is generated in the electron transit layer 2c at a position near the interface between the electron transit layer 2c and the electron supply layer 2e (precisely, the intermediate layer 2d). This 2 DEG is generated due to a difference in lattice constant between a compound semiconductor (e.g., GaN) of the electron transit layer 2c and a compound semiconductor (e.g., InAlGaN) of the electron supply layer 2e and due to a spontaneous polarization difference.

Over the SiC substrate 1, by a MOVPE (Metal Organic Vapor Phase Epitaxy) method, each compound semiconductor is grown as follows. Instead of the MOVPE method, any other appropriate method such as a MBE (Molecular Beam Epitaxy) method may be used.

Over the SiC substrate 1, AlN with a thickness of approximately 100 nm, GaN with a thickness of approximately 1 μm, i (intentionally undoped)-GaN with a thickness of approximately 0.2 μm, AlN with a thickness of approximately 1 nm, and an InAlGaN with a thickness of approximately 10 nm are sequentially grown. Thereby, the nucleation layer 2a, the buffer layer 2b, the electron transit layer 2c, the intermediate layer 2d, and the electron supply layer 2e are formed. The intermediate layer 2d is formed as needed and may not be formed in some cases. As the electron supply layer 2e, instead of InAlGaN, AlGaN having a high Al composition (for example, having an Al composition greater than or equal to 50%) may be grown to form an AlGaN HEMT in some cases. Also, InAlN may be formed as the electron supply layer 2e to form an InAlN HEMT. Also, AlN may be formed as the electron supply layer 2e to form an AlN HEMT.

For a growth condition of AlN, a mixed gas of a trimethylaluminum (TMA) gas and an ammonia ($NH_3$) gas is used as a material gas. For a growth condition of GaN, a mixed gas of a trimethylgallium (TMG) gas and an $NH_3$ gas is used as a material gas. For a growth condition of AlGaN, a mixed gas of a TMA gas, a TMG gas, and an $NH_3$ gas is used as a material gas. For a growth condition of InAlGaN, a mixed gas of a trimethylindium (TMI) gas, a TMA gas, a TMG gas, and an $NH_3$ gas is used as a material gas. Depending on a compound semiconductor layer to be grown, the supply and the flow rates of the TMI gas that is an In source, the TMA gas that is an Al source, and the TMG gas that is a Ga source are set as appropriate. The flow rate of the ammonia gas, which is a common material, is set in a range between approximately 100 ccm and approximately 10 LM. Also, the growth pressure is in a range between approximately 50 Torr and approximately 300 Torr, and the growth temperature is in a range between approximately 700° C. and approximately 1100° C.

Figure 1B:
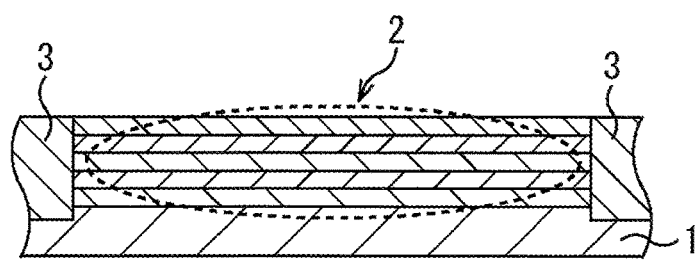

Next, as illustrated in FIG. 1B, element isolation structures 3 are formed.

For example, argon (Ar) is injected into element isolation areas of the compound semiconductor area 2. As a result, the element isolation structures 3 are formed in the compound semiconductor area 2 and the superficial portions of the SiC substrate 1. The element isolation structures 3 define an active area on the compound semiconductor area 2. Note that instead of the injection method described above, the element isolation may be performed by a shallow trench isolation (STI) method. In this case, for example, a chlorine-based etching gas may be used for dry etching of the compound semiconductor area 2.

Figure 1C:
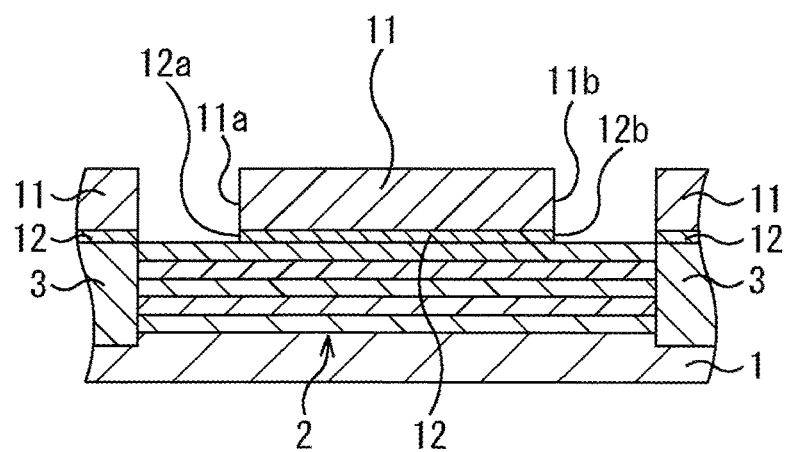

Next, as illustrated in FIG. 1C, a selective growth mask 12 is formed.

Specifically, first, for example, SiN is formed as an insulation film on the entire surface of the compound semiconductor area 2. Deposition of SiN may be performed, for example, by using a plasma CVD method. Also, $SiH_4$ and $NH_3$ gases are used as material gases under a Si-rich film formation condition such that the thickness is approximately 100 nm, for example. The deposited insulation film, which is SiN here, is formed in a relatively low denseness state of containing SiH bonds or N—H bonds at a density of approximately $1 \times 10^{20}/cm^3$ or more. In this SiN, the refractive index with respect to light with a wavelength of 633 nm is, for example, approximately 2.05 or more for stoichiometric SiN. The insulation film may be formed by $SiO_2$ or SiON instead of SiN.

Next, a resist is applied to the surface of the insulation film. The resist is processed by lithography to form, on the resist, openings that expose positions where a source electrode 6 and a drain electrode 7 are to be formed. As a result, a resist mask 11 having two openings 11a and 11b is formed on the insulation film.

Next, using the resist mask 11, dry etching is performed on the insulation film to form openings that expose positions where the source electrode 6 and the drain electrode 7 are to be formed. For the dry etching, a $SF_6$ gas is used, for example. As a result, the selective growth mask 12 having openings 12a and 12b is formed.

Figure 2A:
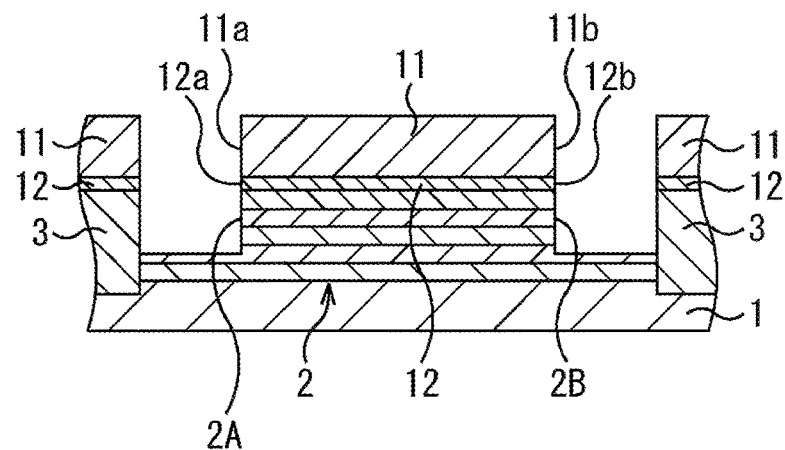
FIGS. 2A to 2C are schematic cross-sectional views sequentially illustrating steps subsequent to the steps in FIGS. 1A to 1C of the method for producing the InAlGaN HEMT according to the first embodiment.

Subsequently, as illustrated in FIG. 2A, recesses 2A and 2B are formed on the compound semiconductor area 2.

More specifically, subsequently using the resist mask 11, dry etching is performed on parts of the compound semiconductor area 2 up to the depth of approximately 50 nm, for example. Here, dry etching is performed from the electron supply layer 2e, the intermediate layer 2d, the electron transit layer 2c up to parts of the buffer layer 2b. As a result, the recesses 2A and 2B are formed on the compound semiconductor area 2. For the dry etching, an inert gas such as Ar and a chlorine-based gas such as $Cl_2$ are used as etching gases.

Figure 2B:
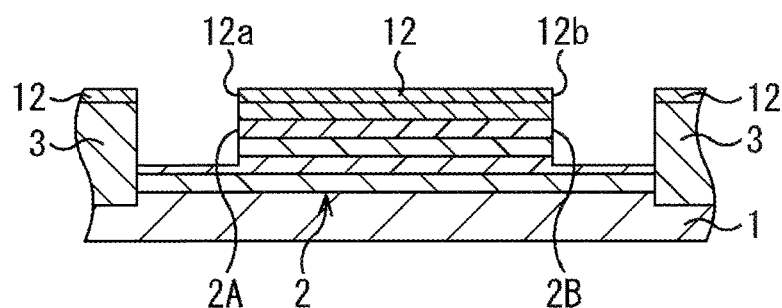

Subsequently, as illustrated in FIG. 2B, the resist mask 11 on the selective growth mask 12 is removed using a heated organic solvent.

Figure 2C:
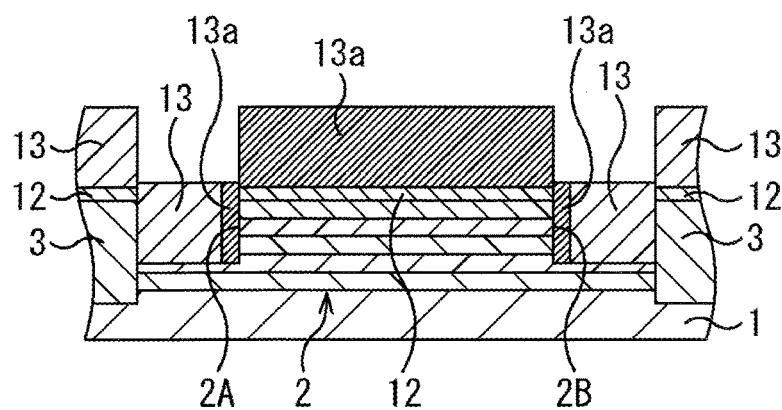

Subsequently, as illustrated in FIG. 2C, $n^+$—GaN 13 is formed.

Specifically, for example, a Si atom beam containing Si as an n-type impurity is emitted by an MBE method or the like to grow (re-grow) the $n^+$—GaN 13. The doping concentration of Si of the $n^+$—GaN 13 is, for example, approximately $2\times10^{19}/cm^3$. For example, the $n^+$—GaN 13 is formed to have a thickness of approximately 100 nm to fill the recesses 2A and 2B and the openings 12a and 12b that are in communication. Here, the $n^+$—GaN 13 is formed, in the recesses 2A and 2B and the openings 12a and 12b that are in communication, in contact with the selective growth mask 12. The selective growth mask 12 is formed in a relatively low denseness state of containing SiH bonds or N—H bonds at a density of approximately $1\times10^{22}/cm^3$ or more as described above. Therefore, Si is further supplied from the selective growth mask 12 into the $n^+$—GaN 13 by heat application during the growth of the $n^+$—GaN 13. On side surface portions near the selective growth mask of the $n^+$—GaN 13, high $n^+$—GaN 13a whose Si concentration is higher than that of the other portions of the $n^+$—GaN 13 is formed.

Figure 3A:
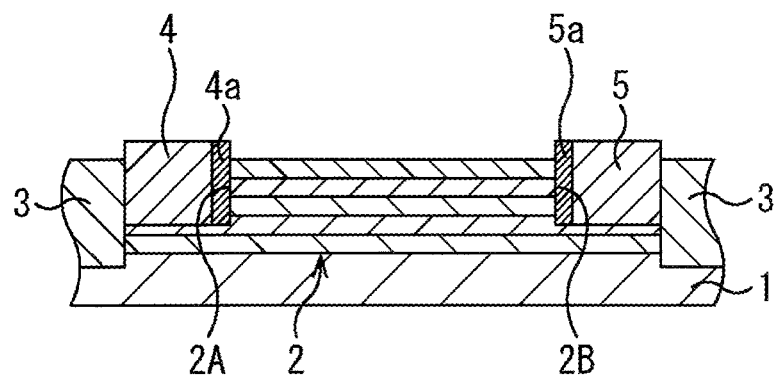
FIGS. 3A to 3C are schematic cross-sectional views sequentially illustrating steps subsequent to the steps in FIGS. 2A to 2C of the method for producing the InAlGaN HEMT according to the first embodiment.

Subsequently, as illustrated in FIG. 3A, GaN plugs 4 and 5 are formed.

Specifically, the selective growth mask 12 and the portions of the $n^+$—GaN 13 and the high $n^+$—GaN 13a on the selective growth mask 12 are selectively removed by a wet process using an aqueous solution of hydrofluoric acid. As a result, the GaN plugs 4 and 5 embedded in the recesses 2A and 2B and protruding slightly upward from the recesses 2A and 2B are formed. The GaN plugs 4 and 5 include, in side surfaces that are interfaces with the compound semiconductor area 2, high concentration dopant layers 4a and 5a (made of the high $n^+$—GaN 13a) containing a dopant whose concentration is higher than that of the other portions (the portions made of the $n^+$—GaN 13) of the GaN plugs 4 and 5. In the GaN plugs 4 and 5, the high concentration dopant layers 4a and 5a are formed integrally with the other portions.

In the high concentration dopant layers 4a and 5a, the concentration of Si that is a dopant is set to, for example, be approximately $1\times10^{20}/cm^3$ or more. The concentration of Si of the high concentration dopant layers 4a and 5a is preferably approximately $1\times10^{21}/cm^3$ or more, and is more preferably approximately $1\times10^{22}/cm^3$ or more. When the concentration of Si of the high concentration dopant layers 4a and 5a is approximately $1\times10^{20}/cm^3$ or more (preferably approximately $1\times10^{21}/cm^3$ or more, and more preferably approximately $1\times10^{22}/cm^3$ or more), ohmic contact resistance can be sufficiently reduced. Because the high concentration dopant layers 4a and 5a are located at the interfaces with the sidewalls of the recesses 2A and 2B of the compound semiconductor area 2, the high concentration dopant layers 4a and 5a contain oxygen (O) or the like in airborne contaminants or the like as a dopant that differs from the dopant (Si) contained in the other portions of the GaN plugs 4 and 5. In other words, the high concentration dopant layers 4a and 5a may contain a dopant that is not contained in the other portions of the GaN plugs 4 and 5.

Figure 3B:
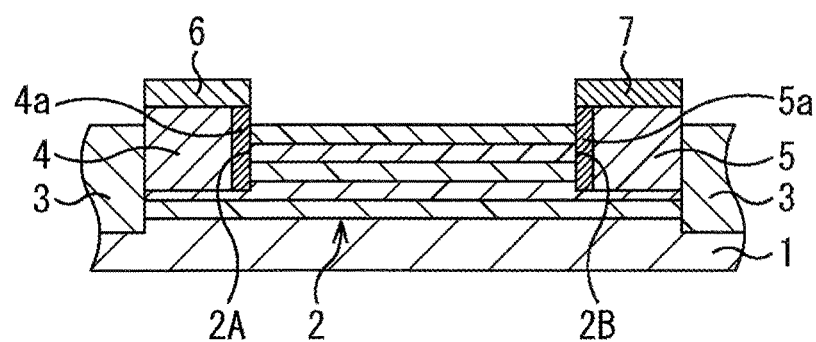

Next, as illustrated in FIG. 3B, the source electrode 6 and the drain electrode 7 that are ohmic electrodes are formed.

Specifically, first, a resist mask for forming the source electrode 6 and the drain electrode 7 is formed. In this example, an eaves-structure two-layer resist suitable for a vapor deposition method and a lift-off method is used. This resist is applied onto the compound semiconductor area 2, and openings that expose the upper surfaces of the GaN plugs 4 and 5 are formed. As a result, the resist mask having the openings is formed.

Using this resist mask, electrode materials such as Ti (lower layer) and Al (upper layer) are deposited by, for example, a high vacuum vapor deposition method on the resist mask having the openings that expose the upper surfaces of the GaN plugs 4 and 5. The thickness of Ti is approximately 20 nm, and the thickness of Al is approximately 200 nm. Next, the resist mask and Ti/Al deposited on the resist mask are removed by a lift-off method. Then, the SiC substrate 1 is heat-treated in, for example, a nitrogen atmosphere at a temperature approximately between 550° C. and 600° C. for alloying of remaining Ti/Al with the GaN Plugs 4 and 5. Thereby, an ohmic contact between Ti/Al and GaN of the GaN plugs 4 and 5 is established. Through the above process, the source electrode 6 is formed on the GaN plug 4 and the drain electrode 7 is formed on the GaN plug 5. The position of the GaN plug 4 is aligned with the source electrode 6 directly below the source electrode 6, and the position of the GaN plug 5 is aligned with the drain electrode 7 directly below the drain electrode 7.

Figure 3C:
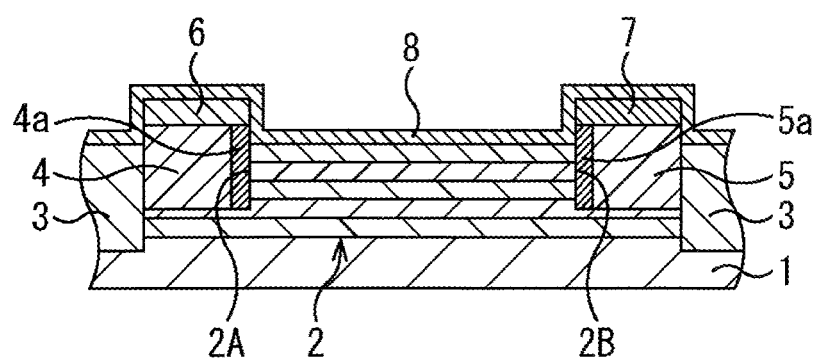

Subsequently, as illustrated in FIG. 3C, a protective film 8 is formed.

Specifically, an insulator, for example, a SiN film is formed so as to cover the entire surface. Deposition of SiN may be performed, for example, by a plasma CVD method. Also, $SiH_4$ and $NH_3$ gases are used as material gases such that the thickness is approximately 50 nm, for example. In this deposited SiN, the refractive index with respect to light with a wavelength of 633 nm is, for example, approximately 2.0 for stoichiometric SiN. As a result, the protective film 8 is formed.

Figure 4A:
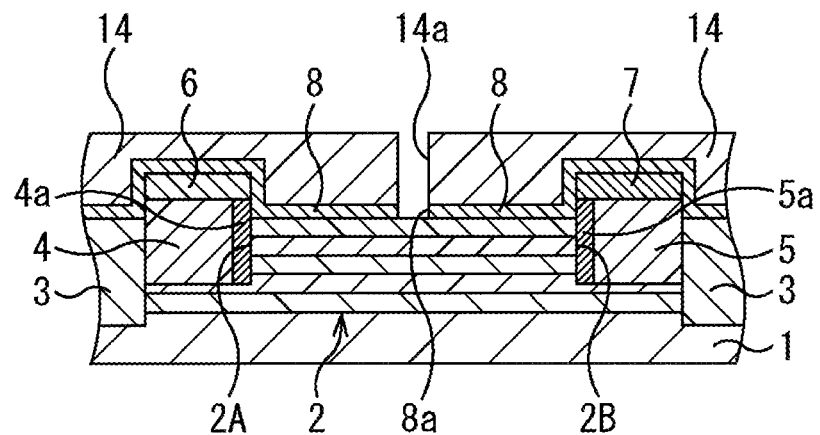
FIGS. 4A and 4B are schematic cross-sectional views sequentially illustrating steps subsequent to the steps in FIGS. 3A to 3C of the method for producing the InAlGaN HEMT according to the first embodiment.

Subsequently, as illustrated in FIG. 4A, an opening 8a is formed in the protective film 8. Specifically, first, a single-layer electron beam resist is applied onto the protective film 8. The electron beam resist is formed by a spin coating method and pre-baking, using, for example, PMMA (manufactured by MicroChem Corp., USA). The electron beam is caused to enter the resist to be exposed to light and developed so as to form, at the area where a gate electrode 9 is to be formed in the resist, an opening having a length of, for example, 0.1 μm or longer in the current direction. As a result, a resist mask 14 having an opening 15a is formed.

Next, using the resist mask 14, dry etching is performed on the protective film 8. Thus, the opening 8a is formed at an area where the gate electrode 9 is to be formed in the protective film 8. The resist mask 14 is removed by a wet process or the like using a chemical liquid.

Figure 4B:
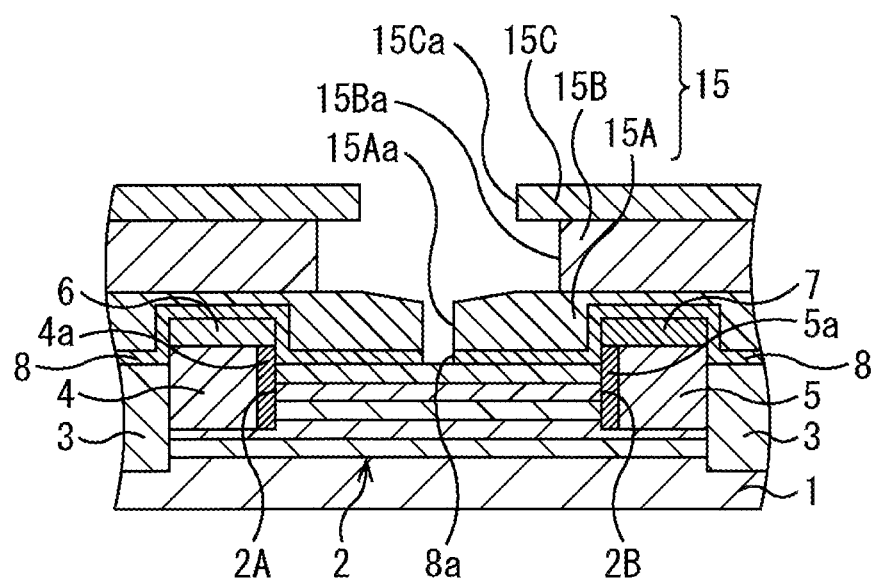

Subsequently, as illustrated in FIG. 4B, a three-layer electron beam resist 15 for forming the gate electrode 9 is formed.

The three-layer electron beam resist 15 is composed of, for example, PMMA (manufactured by MicroChem Corp., USA) as a lower layer resist 15A, PMGI (manufactured by MicroChem Coro., USA) as an intermediate layer resist 15B, and ZEP520 (manufactured by Zeon Corporation) as an upper layer resist 15C. The three-layer electron beam resist 15 is formed by, for example, a spin coating method and pre-baking. An electron beam is caused to enter the upper layer resist 15C to expose the upper layer resist 15C with light for a length of approximately 0.8 μm in the current direction. After electron beam lithography, an opening 15Ca having a length of 0.8 μm is formed in the upper layer resist 15C using, for example, liquid developer ZEP-SD (manufactured by Zeon Corporation).

Next, using, for example, NMD-W (manufactured by TOKYO OHKA KOGYO Co., Ltd.), an area set back by approximately 0.5 μm from the ends of the opening 15Ca of the upper layer resist 15C toward the source electrode 6 and the drain electrode 7 is removed to form an opening 15Ba in the intermediate layer resist 15B.

Next, an electron beam is caused to enter the lower layer resist 15A at the central portion of the opening 15Ba of the intermediate layer resist 15B so as to include the opening 8a of the protective film 8 for a length of approximately 0.15 μm in the current direction, thereby exposing the lower layer resist 15A to light. After electron beam lithography, an opening 15Aa having a length of 0.15 μm is formed in the lower layer resist 15A using, for example, liquid developer ZMD-B (manufactured by Zeon Corporation).

Figure 5A:
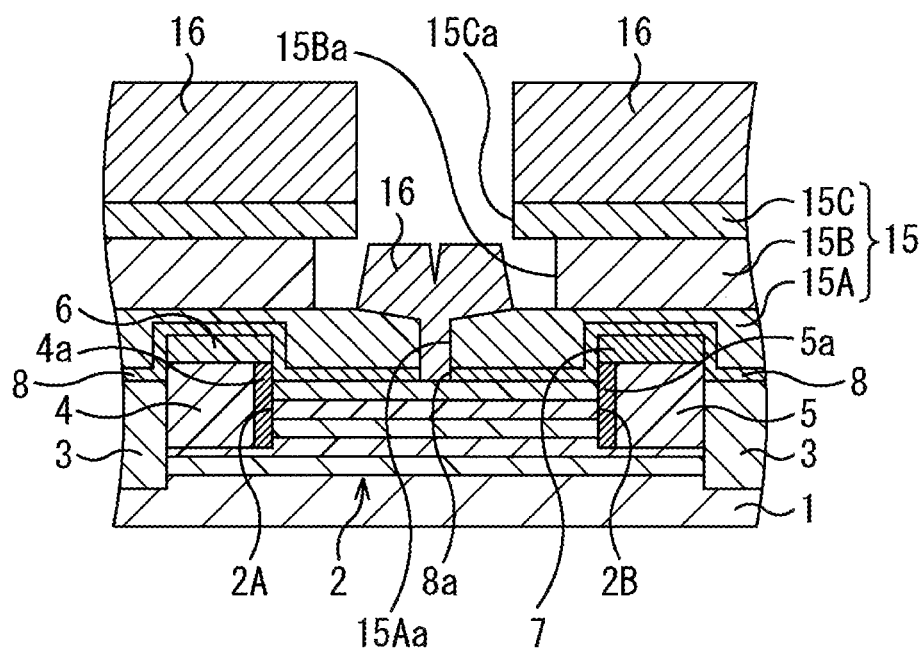
FIGS. 5A and 5B are schematic cross-sectional views sequentially illustrating steps subsequent to the steps in FIGS. 4A and 4B of the method for producing the InAlGaN HEMT according to the first embodiment.

Subsequently, as illustrated in FIG. 5A, electrode materials 16 are formed. For example, Ni/Au is deposited as the electrode materials 16 by, for example, a high vacuum vapor deposition method using the three-layer electron beam resist 15 as a mask. The thickness of Ni is approximately 10 nm and the thickness of Au is approximately 300 nm.

Figure 5B:
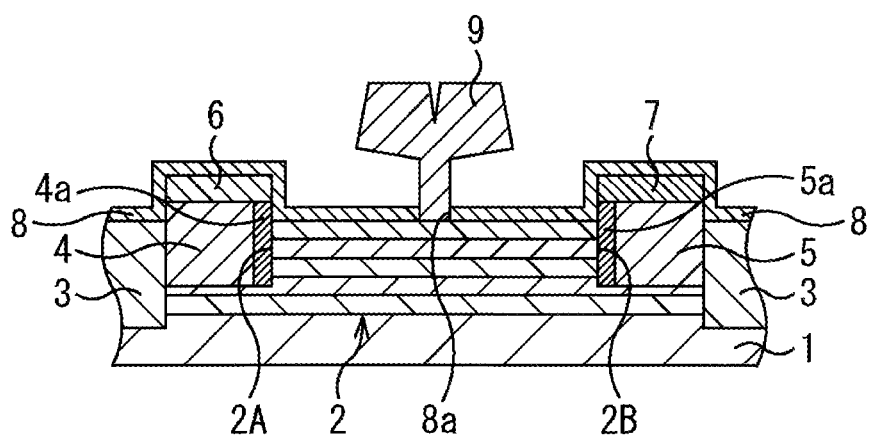

Subsequently, as illustrated in FIG. 5B, the gate electrode 9 is formed. Using a heated organic solvent, the three-layer electron beam resist 15 and the electrode materials 16 deposited on the three-layer electron beam resist 15 are removed by a lift-off method. Through the above process, the gate electrode 9 is formed such that a part of the electrode materials 16 is embedded in the opening 8a of the protective film 8.

Thereafter, through steps of forming wires electrically connected to the source electrode 6, the drain electrode 7, and the gate electrode 9 and insulation films between layers as needed, an InAlGaN HEMT according to the first embodiment is formed.

In the following, effects of the InAlGaN HEMT according to the present embodiment will be described based on a comparison with a conventional InAlGaN HEMT.

In a conventional InAlGaN HEMT or an AlGaN HEMT including an electron supply layer with high Al composition, the ohmic contact resistance of the source electrode and the drain electrode, which are ohmic electrodes, is high. Therefore, a large current between the source electrode and the drain electrode due to a high two-dimensional electron density, which is a feature of such a material system, is not obtained. One cause of this high ohmic contact resistance is a high energy barrier (a barrier between a metal a semiconductor) due to high Al composition. In an ohmic electrode of a GaAs device or the like, an original schottky property disappears due to alloying/mixed crystals reaction, and the ohmic electrode forms an ohmic contact. Conversely, in a nitride semiconductor, it is considered that clear mixed crystals reaction does not progress easily, and the schottky property remains partly even after alloying between the ohmic electrode and the nitride semiconductor. Therefore, a high energy barrier formed at a metal-semiconductor interface as described above is a cause of increasing the ohmic contact resistance.

Figure 6:
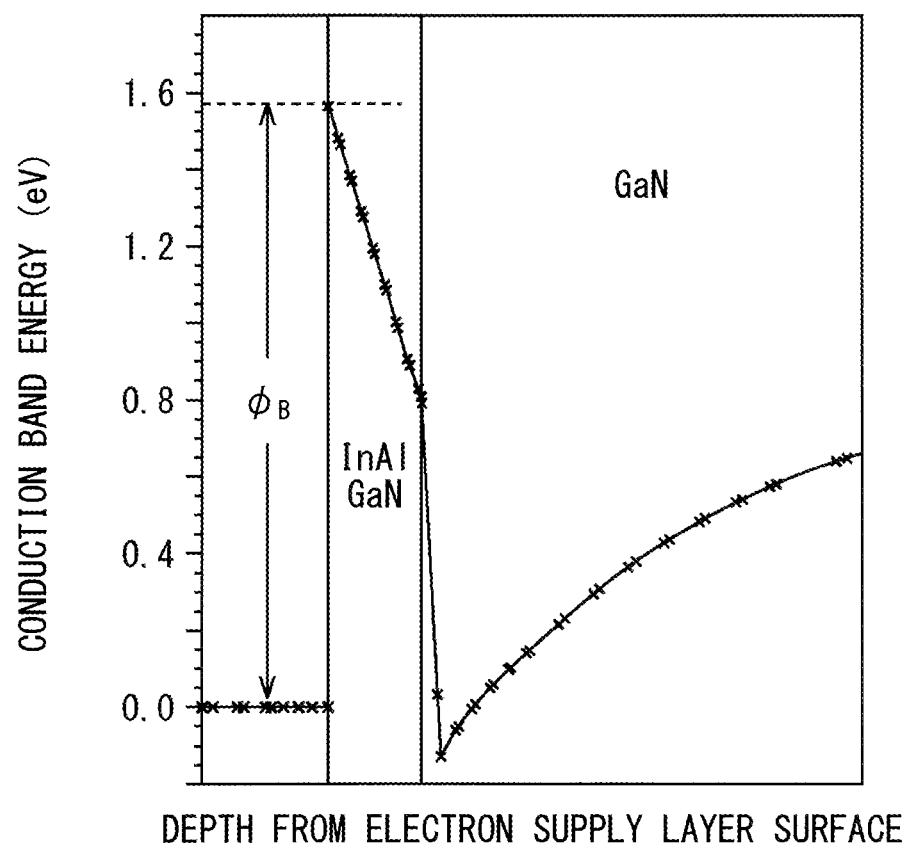
FIG. 6 is a characteristic diagram illustrating a band structure (a band structure before the structure is changed due to alloying) of a metal (Ni)-semiconductor interface for a source electrode and a drain electrode of a conventional InAlGaN HEMT (not having a cap layer)

FIG. 6 is a characteristic diagram illustrating a band structure (a band structure before the structure is changed due to alloying) of a metal (Ni)-semiconductor interface for a source electrode and a drain electrode of a conventional InAlGaN HEMT (not having a GaN plug). Due to a large energy barrier, it is predicted that an electric current due to tunneling is limited and the ohmic contact resistance is high. This large ohmic contact resistance decreases the maximum current between the source electrode and the drain electrode and directly affects the output characteristics of an amplifier or the like. Furthermore, an electric field concentration due to the high contact resistance of the ohmic electrodes promotes physical and chemical changes, thereby decreasing the reliability of the ohmic electrodes.

As a method of reducing the above described ohmic contact, it is considered promising to selectively regrow a low energy barrier material such as n-GaN or n-InGaN (formation of a GaN plug) at a portion where an ohmic electrode is formed. However, in this case, it is inevitable for two-dimensional electron gas and the plug to be essentially point-connected, and this results in instability.

This connection point (connection interface) is a connection part of the GaN plug with the recess side wall of the compound semiconductor area due to selective regrowth, and is in a state where barriers (acceptors etc.) against electrons due to atmospheric contaminants and bonding defects easily form. In the connection part of the GaN plug with the recess side wall of the compound semiconductor area due to selective regrowth, a carrier concentration lowering area is generated. Due to the presence of this carrier concentration lowering area, a decrease of the two-dimensional electron gas concentration, destabilization of the point connection performance between the two-dimensional electron gas and the GaN plug, dependence of contact resistance on the structure of the GaN plug, etc. are caused.

Figure 7A:
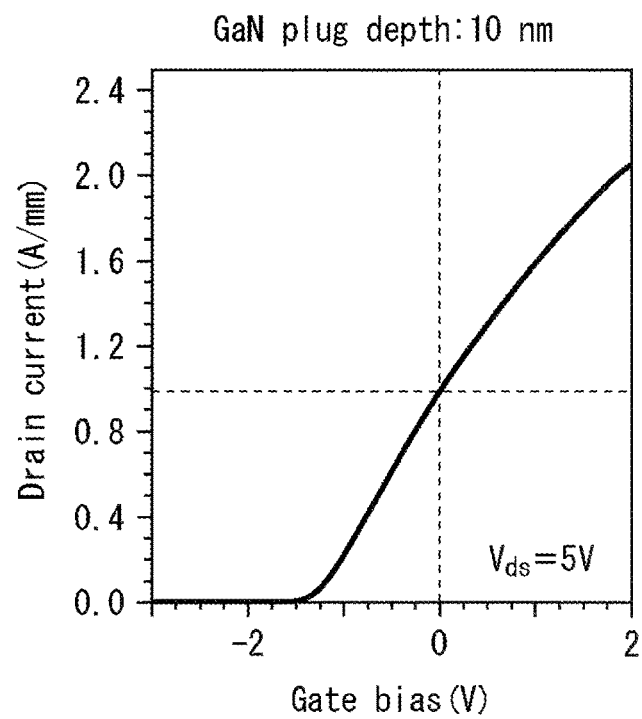
FIGS. 7A and 7B are characteristic diagrams each of which illustrates a GaN plug structure dependence with respect to a relationship between a gate voltage and a drain current.
Figure 7B:
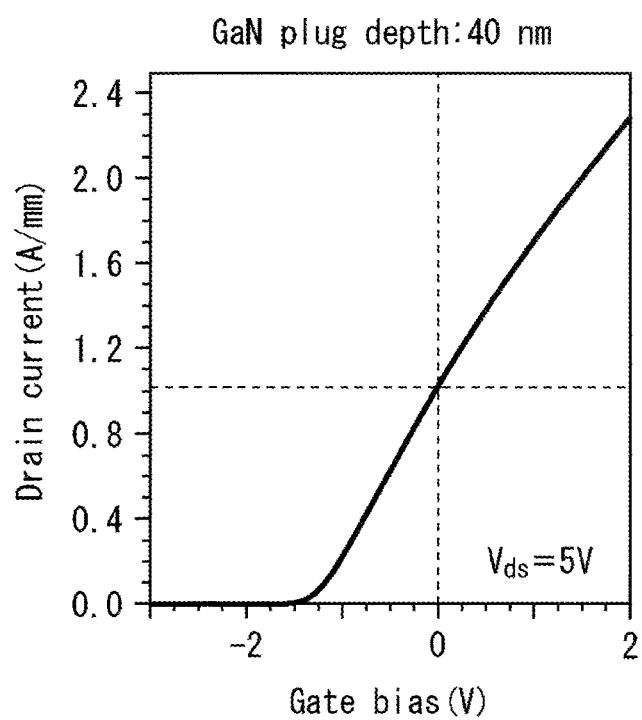

FIGS. 7A and 7B are characteristic diagrams each of which illustrates a GaN plug structure dependence with respect to a relationship between a gate voltage and a drain current. FIG. 7A illustrates a case in which the depth (height) of GaN plugs is 10 nm, and FIG. 7B illustrates a case in which the depth (height) of GaN plugs is 40 nm.

For example, when a carrier concentration lowering layer having a carrier concentration of approximately $10^{19}/cm^3$ is generated, it is found that a depth dependence of the GaN plugs appears in the gate voltage-drain current characteristics. Specifically, when the depth of the GaN plugs changes from 40 nm to 10 nm, the maximum drain current decreases by approximately 10%. Such a GaN plug structure dependence of the maximum drain current affects the uniformity of device electrical characteristics.

Figure 8A:
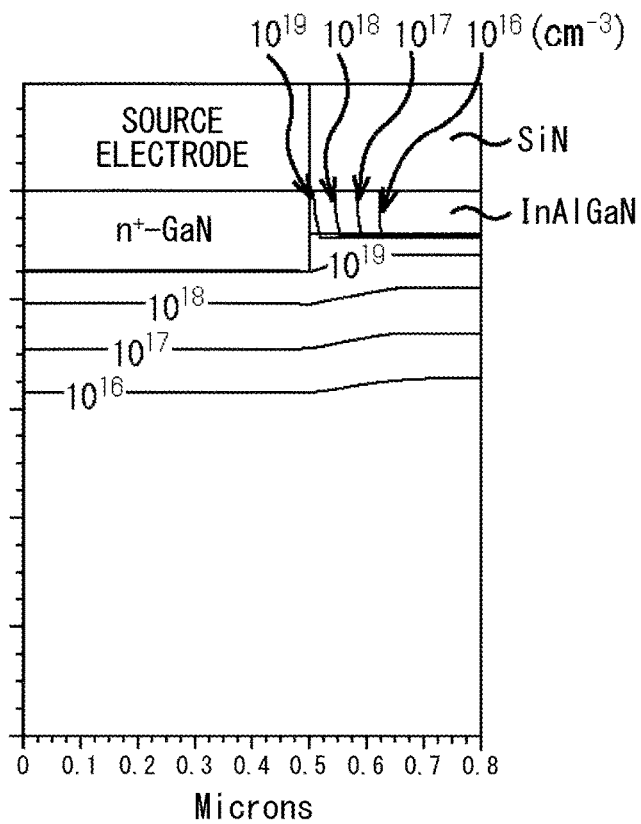
FIGS. 8A to 8C are characteristic diagrams illustrating calculation results, for the first embodiment and comparative examples, of carrier concentration distributions in InAlGaN HEMTs to which a selective regrown process is applied.
Figure 8B:
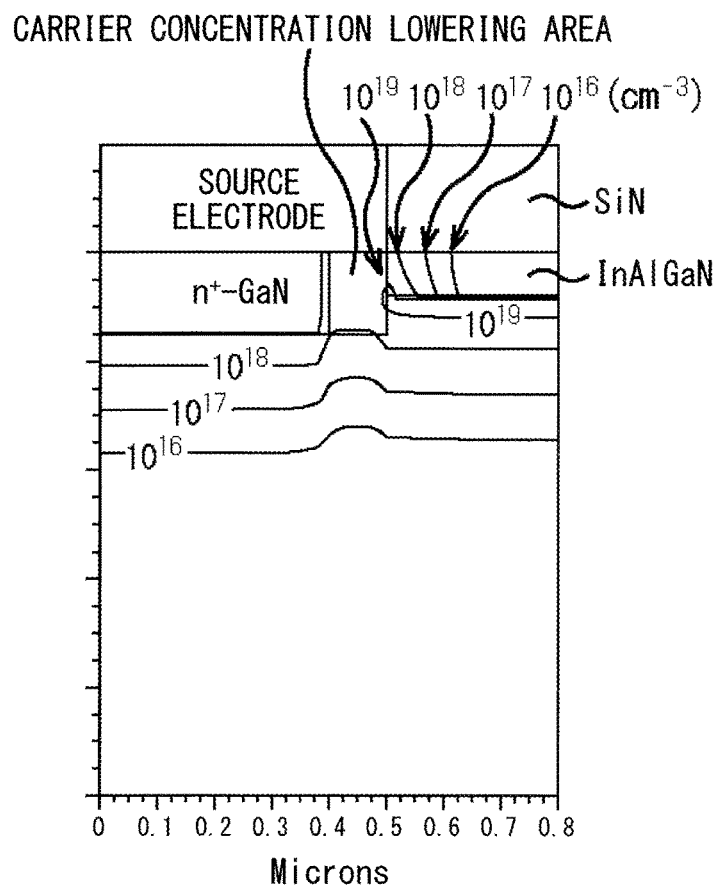
Figure 8C:
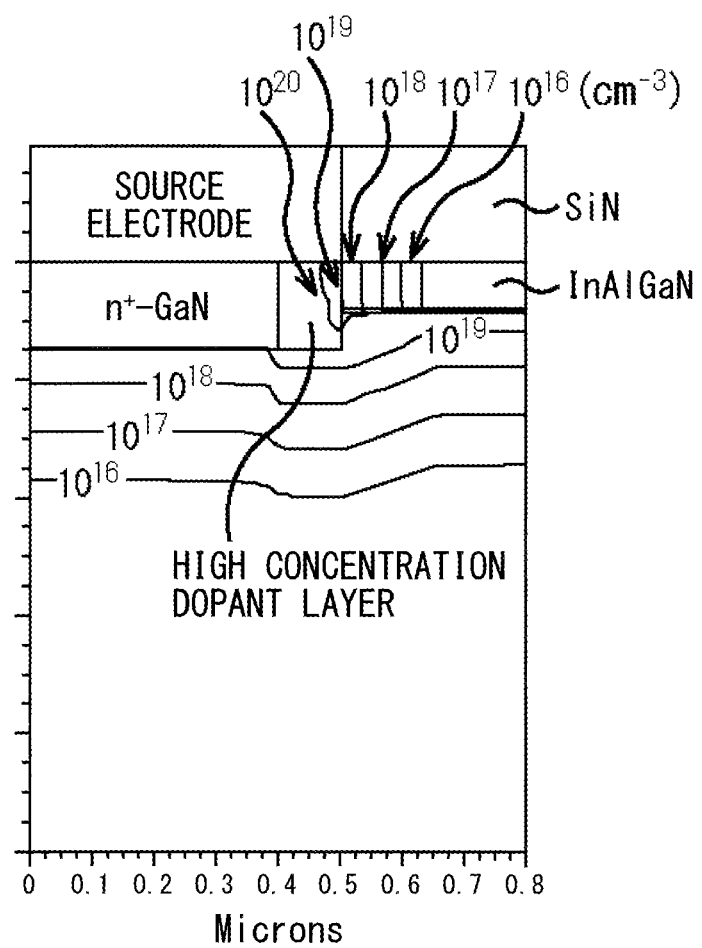

FIGS. 8A to 8C are characteristic diagrams illustrating calculation results, for the first embodiment and comparative examples, of carrier concentration distributions in InAlGaN HEMTs to which a selective regrown process is applied. FIG. 8A indicates a carrier concentration distribution in an ideal state in which a sufficient carrier concentration is ensured in the entire plug area without having a high concentration dopant layer (Comparative Example 1). FIG. 8B indicates an actual carrier concentration distribution by a GaN plug without having a high concentration dopant layer (Comparative Example 2). FIG. 8C indicates a carrier concentration distribution of the first embodiment including a high concentration dopant layer. The unit of the carrier concentration is in $cm^{-3}$.

In FIG. 8A, the carrier concentration does not decrease in the GaN plug. It can be found from FIG. 8B that the carrier concentration decreases at the connection portion with the recess side wall of the compound semiconductor area of the GaN plug, and a carrier concentration lowering area that affects the electric conduction appears. This carrier concentration lowering area is a cause of a depth dependence of the GaN plugs in the gate voltage-drain current characteristics as described above. With respect to the above, in FIG. 8C of the first embodiment, it can be found that a high concentration dopant layer is formed on the side surface portion of the GaN plug that is the interface with the compound semiconductor area, thereby sufficiently suppressing generation of the carrier concentration lowering area. Therefore, an increase in ohmic contact resistance and ohmic contact resistivity caused by a decrease in carrier concentration due to airborne contaminants and bonding defects at the connection portions of the GaN plugs with the recess side walls of the compound semiconductor area at the time of regrowth is suppressed.

Figure 9A:
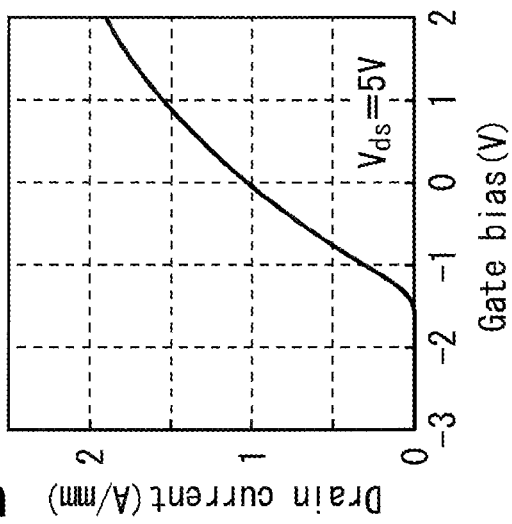
FIGS. 9A to 9D are characteristic diagrams illustrating electrical characteristics of the InAlGaN HEMT according to the first embodiment.
Figure 9B:
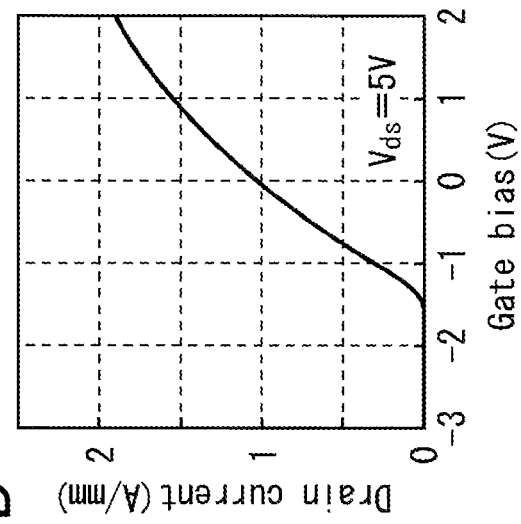
Figure 9C:
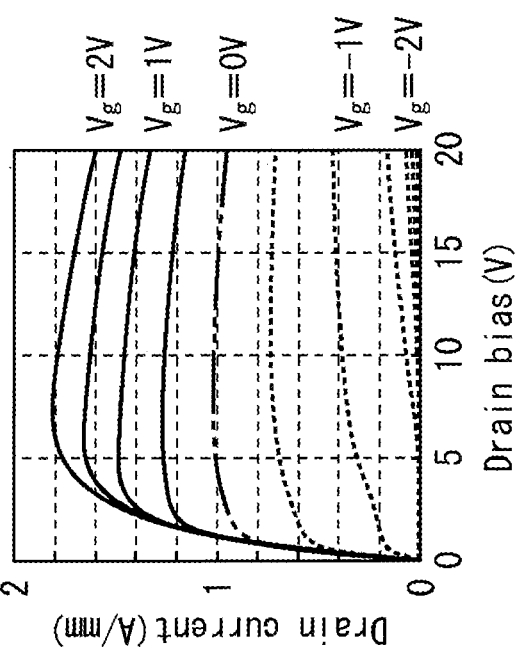
Figure 9D:
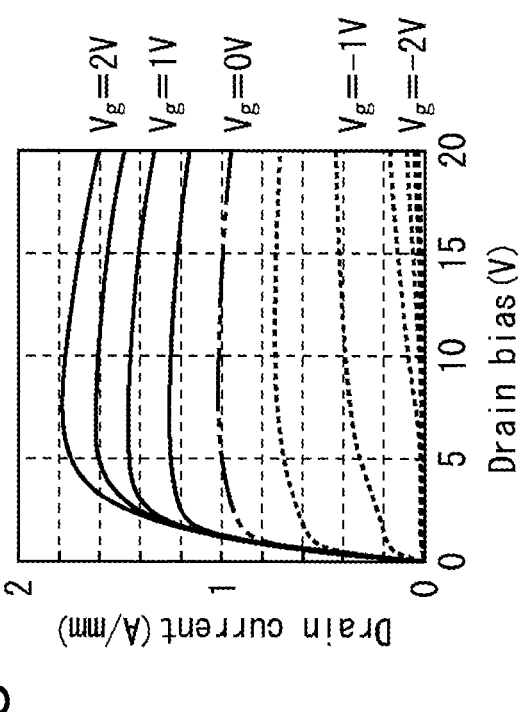

FIGS. 9A to 9D are characteristic diagrams illustrating electrical characteristics of the InAlGaN HEMT according to the first embodiment. FIGS. 9A and 9B indicate a case in which the depth (height) of the GaN plugs is 10 nm, and FIGS. 9C and 9D indicate a case in which the depth (height) of the GaN plugs is 40 nm. Each of FIGS. 9A and 9C indicates the relationship between the drain voltage and the drain current, and each of FIGS. 9B and 9D indicates the relationship between the gate voltage and the drain current. According to the first embodiment, it can be found that a low ON resistance and a large maximum drain current can be obtained, and electrical characteristics with no dependence on the structure of the GaN plugs can be obtained.

As described above, according to the first embodiment, it is possible to realize an InAlGaN HEMT suppressing generation of a carrier concentration lowering area in compound semiconductor plugs provided under a source electrode and a drain electrode and having a low dependence on the structure of the compound semiconductor plugs.

Variation Example

Here, a variation example of the first embodiment will be described.

This variation example slightly differs from the first embodiment in high concentration dopant layers generated in GaN plugs.

Figure 10:
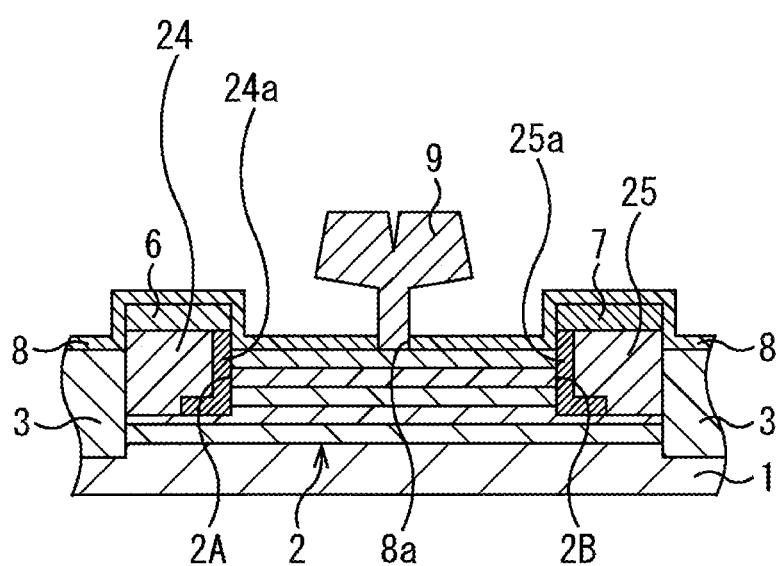
FIG. 10 is a schematic cross-sectional view illustrating a configuration of an InAlGaN HEMT according to a variation example of the first embodiment.

FIG. 10 is a schematic cross-sectional view illustrating a configuration of an InAlGaN HEMT according to the variation example of the first embodiment.

In this variation example, in the step of FIG. 1C, for example, using a plasma CVD method, $SiH_4$ and $NH_3$ gases are used as material gases under a Si-rich film formation condition such that SiN is formed to have a thickness of approximately 100 nm, for example. Thereby, the deposited insulation film, which is SiN here, is formed in a relatively low denseness state of containing SiH bonds or N—H bonds at a density of approximately $2\times10^{22}/cm^3$ or more. This SiN is rich in Si such that the refractive index is, for example, approximately 2.05 or more with respect to light having a wavelength of 633 nm. The insulation film may be formed by $SiO_2$ or SiON instead of SiN.

In the step of FIG. 2C, $n^+$—GaN is formed similarly to the first embodiment. The selective growth mask 12 is rich in Si such that the refractive index is, for example, approximately 2.05 or more with respect to light having a wavelength of 633 nm as described above. Therefore, Si is further supplied from the selective growth mask 12 into $n^+$—GaN by a heat process during the growth of $n^+$—GaN. Together with the side surface adjacent to the selective growth mask 12 of $n^+$—GaN, Si diffuses to a part of the bottom surface of $n^+$—GaN, and high $n^+$—GaN whose Si concentration is higher than in the other parts of the $n^+$—GaN is formed.

Then, in the step of FIG. 3A, GaN plugs 24 and 25 are formed. The GaN plugs 24 and 25 include high concentration dopant layers 24a and 25a (made of high $n^+$—GaN) containing a dopant whose concentration is higher than that of the other portions (the portions made of $n^+$—GaN) of the GaN plugs 24 and 25. The high concentration dopant layers 24a and 25a are formed on the side surface portions that are the interfaces with the compound semiconductor area 2 of the GaN plugs 24 and 25. According to this example, the high concentration dopant layers 24a and 25a each have an L shape in a cross section, with the bottom portion of the side surface portion protruding from the side surface portion toward the inside of the GaN plugs 24 and 25.

In the GaN plugs 24 and 25, the high concentration dopant layers 24a and 25a are formed integrally with the other portions. In the high concentration dopant layers 24a and 25a, the concentration of Si that is a dopant is set to, for example, be approximately $1\times10^{20}/cm^3$ or more. The concentration of Si of the high concentration dopant layers 24a and 25a is preferably approximately $1\times10^{21}/cm^3$ or more, and is more preferably approximately $1\times10^{22}/cm^3$ or more. When the concentration of Si of the high concentration dopant layers 24a and 25a is approximately $1\times10^{20}/cm^3$ or more (preferably approximately $1\times10^{21}/cm^3$ or more, and more preferably approximately $1\times10^{22}/cm^3$ or more), ohmic contact resistance can be sufficiently reduced. Because the high concentration dopant layers 24a and 25a are located at the interfaces with the sidewalls of the recesses 2A and 2B of the compound semiconductor area 2, the high concentration dopant layers 24a and 25a contain oxygen (O) or the like in airborne contaminants or the like as a dopant that differs from the dopant (Si) contained in the other portions of the GaN plugs 24 and 25.

The other steps are similar to those of the first embodiment.

As described above, according to the variation example, it is possible to realize an InAlGaN HEMT suppressing generation of a carrier concentration lowering area in compound semiconductor plugs provided under a source electrode and a drain electrode and having a low dependence on the structure of the compound semiconductor plugs.

Second Embodiment

Similarly to the first embodiment, an InAlGaN HEMT that is a nitride semiconductor will be described as a compound semiconductor device according to a second embodiment. The second embodiment slightly differs from the first embodiment in GaN plugs.

FIGS. 11 and 12 are schematic cross-sectional views sequentially illustrating steps of a method for producing an InAlGaN HEMT according to the second embodiment.

First, steps similar to those of FIG. 1A and FIG. 1B according to the first embodiment are performed. As a result, an element isolation structure 3 is formed in a compound semiconductor area 2 including a nucleation layer 2a, a buffer layer 2b, an electron transit layer 2c, an intermediate layer 2d, and an electron supply layer 2e.

Figure 11A:
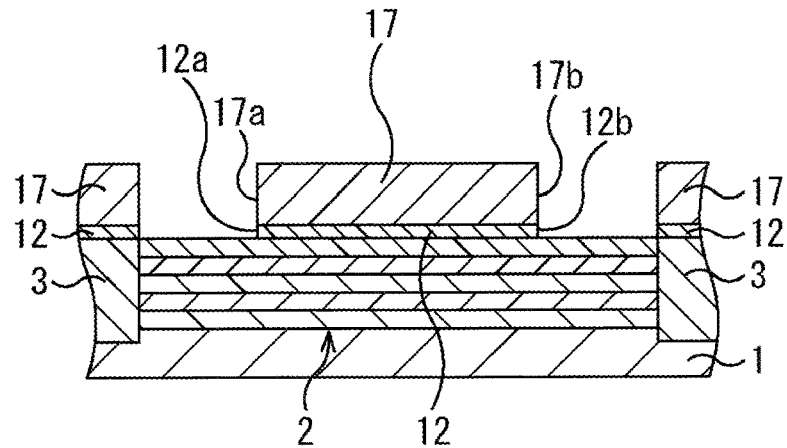
FIGS. 11A to 11C are schematic cross-sectional views illustrating main steps of a method for producing an InAlGaN HEMT according to a second embodiment.

Next, as illustrated in FIG. 11A, a selective growth mask 12 is formed.

Specifically, first, for example, SiN is formed as an insulation film on the entire surface of the compound semiconductor area 2. Deposition of SiN may be performed, for example, by a plasma CVD method. Also, $SiH_4$ and $NH_3$ gases are used as material gases under a Si-rich film formation condition such that the thickness is approximately 100 nm, for example. The deposited insulation film, which is SiN here, is formed in a relatively low denseness state of containing SiH bonds or N—H bonds at a density of approximately $1\times10^{22}/cm^3$ or more. In this SiN, the refractive index with respect to light with a wavelength of 633 nm is, for example, approximately 2.05 or more. The insulation film may be formed by $SiO_2$ or SiON instead of SiN.

Next, a resist is applied to the surface of the insulation film. The resist is processed by lithography to form, on the resist, openings that expand, by a predetermined distance with respect to positions where a source electrode and a drain electrode are to be formed. The predetermined distance is, for example, approximately 0.1 μm. As a result, the resist mask 17 having two openings 17a and 17b is formed on the insulation film.

Next, using the resist mask 17, dry etching is performed on the insulation film to form openings that expose positions that expand by the predetermined distance with respect to the positions where the source electrode and the drain electrode are to be formed. For the dry etching, a $SF_6$ gas is used, for example. As a result, the selective growth mask 12 having openings 12a and 12b is formed. The resist mask 17 is removed using a heated organic solvent.

Figure 11B:
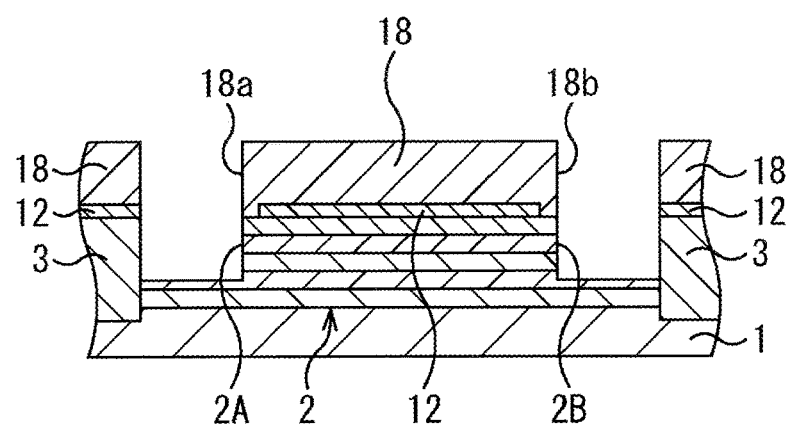

Subsequently, as illustrated in FIG. 11B, recesses 2A and 2B are formed on the compound semiconductor area 2.

Specifically, a resist is applied to the entire surface. The resist is processed by lithography to form, on the resist, openings that expose positions where a source electrode and a drain electrode are to be formed. As a result, a resist mask 18 having openings 18a and 18b narrower by approximately 0.1 μm than the openings 12a and 12b of the selective growth mask 12 is formed. The resist mask 18 covers the selective growth mask 12 and parts of the electron supply layer 2e (portions having a width of approximately 0.1 μm) exposed from both ends of the selective growth mask 12.

Subsequently, using the resist mask 18, dry etching is performed on parts of the compound semiconductor area 2 up to the depth of approximately 50 nm, for example. Here, dry etching is performed from the electron supply layer 2e, the intermediate layer 2d, the electron transit layer 2c up to parts of the buffer layer 2b. As a result, the recesses 2A and 2B are formed on the compound semiconductor area 2. For the dry etching, an inert gas such as Ar and a chlorine-based gas such as $Cl_2$ are used as etching gases. The resist mask 18 is removed using a heated organic solvent.

Figure 11C:
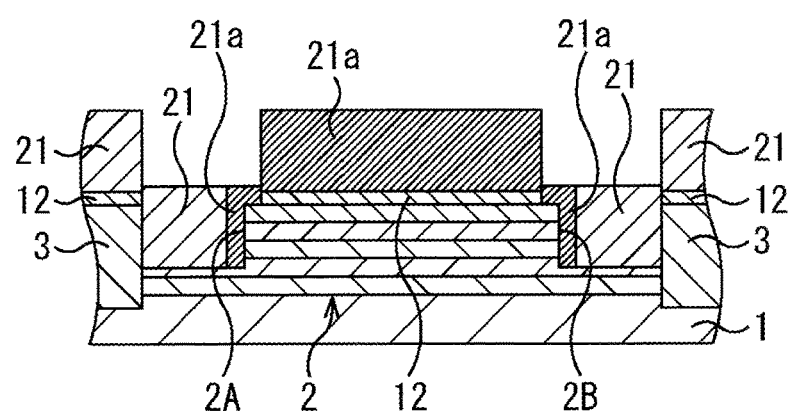

Subsequently, as illustrated in FIG. 11C, $n^+$—GaN 21 is formed.

Specifically, for example, a Si atom beam containing Si as an n-type dopant is emitted by an MBE method or the like to grow (re-grow) the $n^+$—GaN 21. The doping concentration of Si of the $n^+$—GaN 21 is, for example, approximately $2\times10^{19}/cm^3$. For example, the $n^+$—GaN 21 is formed to have a thickness of approximately 70 nm to fill the recesses 2A and 2B and the openings 12a and 12b that are in communication. Here, the $n^+$—GaN 21 is formed, in the recesses 2A and 2B and the openings 12a and 12b that are in communication, in contact with the selective growth mask 12. The selective growth mask 12 is formed in a relatively low denseness state of containing SiH bonds or N—H bonds at a density of approximately $1\times10^{22}/cm^3$ or more as described above. Therefore, Si is further supplied from the selective growth mask 12 into the $n^+$—GaN 21 by a heat process during the growth of the $n^+$—GaN 21. On portions near the selective growth mask 12 of the $n^+$—GaN 21, high $n^+$—GaN 21a whose Si concentration is higher than that of the other portions of the $n^+$—GaN 21 is formed.

Figure 12A:
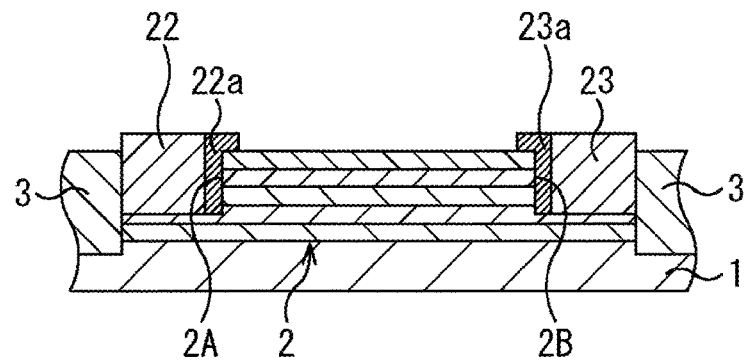
FIGS. 12A to 12C are schematic cross-sectional views illustrating main steps subsequent to the steps in FIGS. 11A to 11C of the method for producing the InAlGaN HEMT according to the second embodiment.

Subsequently, as illustrated in FIG. 12A, GaN plugs 22 and 23 are formed.

Specifically, the selective growth mask 12 and the portions of the $n^+$—GaN 21 and the high $n^+$—GaN 21a on the selective growth mask 12 are selectively removed by a wet process using an aqueous solution of hydrofluoric acid. As a result, the GaN plugs 22 and 23 filling the recesses 2A and 2B and protruding slightly upward from the recesses 2A and 2B are formed. The GaN plugs 22 and 23 include high concentration dopant layers 22a and 23a (made of the high $n^+$—GaN 21a) containing a dopant whose concentration is higher than that of the other portions (the portions made of the $n^+$—GaN 21) of the GaN plugs 22 and 23.

The high concentration dopant layers 22a and 23a are formed on the side surface portions that are the interfaces with the compound semiconductor area 2. According to the present embodiment, the high concentration dopant layers 22a and 23a each have an inverted L shape in a cross section, with the upper portion of the side surface portion protruding toward the inside of the compound semiconductor area 2 (toward the gate electrode 9). Due to this shape, each of the high concentration dopant layers 22a and 23a partially overlaps the electron supply layer 2e in plan view.

In the GaN plugs 22 and 23, the high concentration dopant layers 22a and 23a are formed integrally with the other portions. In the high concentration dopant layers 22a and 23a, the concentration of Si that is a dopant is set to, for example, be approximately $1\times10^{20}/cm^3$ or more. The concentration of Si of the high concentration dopant layers 22a and 23a is preferably approximately $1\times10^{21}/cm^3$ or more, and is more preferably approximately $1\times10^{22}/cm^3$ or more. When the concentration of Si of the high concentration dopant layers 22a and 23a is approximately $1\times10^{20}/cm^3$ or more (preferably approximately $1\times10^{21}/cm^3$ or more, and more preferably approximately $1\times10^{22}/cm^3$ or more), ohmic contact resistance can be sufficiently reduced. Because the high concentration dopant layers 22a and 23a are located at the interfaces with the sidewalls of the recesses 2A and 2B of the compound semiconductor area 2, the high concentration dopant layers 22a and 23a contain oxygen (O) or the like in airborne contaminants or the like as a dopant that differs from the dopant (Si) contained in the other portions of the GaN plugs 22 and 23.

Figure 12B:
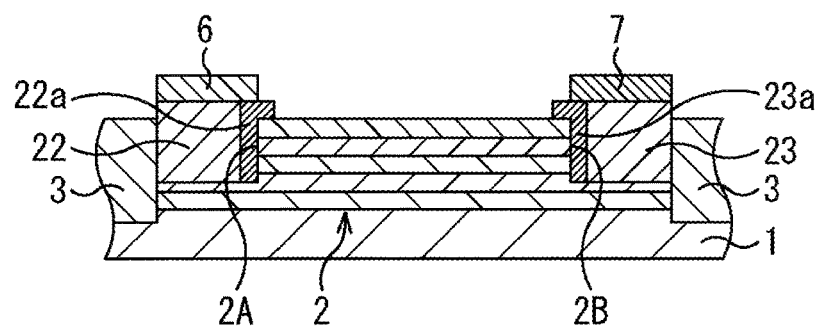

Next, as illustrated in FIG. 12B, a source electrode 6 and a drain electrode 7 that are ohmic electrodes are formed.

Specifically, first, a resist mask for forming the source electrode 6 and the drain electrode 7 is formed. In this example, an eaves-structure two-layer resist suitable for a vapor deposition method and a lift-off method is used. This resist is applied onto the compound semiconductor area 2, and openings that expose the upper surfaces of the GaN plugs 22 and 23 are formed. As a result, the resist mask having the openings is formed.

Using this resist mask, electrode materials such as Ti (lower layer) and Al (upper layer) are deposited by, for example, a high vacuum vapor deposition method on the resist mask having openings that expose the upper surfaces of the GaN plugs 22 and 23. The thickness of Ti is approximately 20 nm, and the thickness of Al is approximately 200 nm. Next, the resist mask and Ti/Al deposited on the resist mask are removed by a lift-off method. Then, the Si substrate 1 is heat-treated in, for example, a nitrogen atmosphere at a temperature approximately between 550° C. and 600° C. for alloying of remaining Ti/Al with the GaN Plugs 22 and 23. Thereby, an ohmic contact between Ti/Al and GaN of the GaN plugs 22 and 23 is established. Through the above process, the source electrode 6 is formed on the GaN plug 22 and the drain electrode 7 is formed on the GaN plug 23. The source electrode is provided on the GaN plug 22, and an upper surface portion of the high concentration dopant layer 22a protrudes from one end on the gate electrode 9 side of the source electrode 6 in plan view. The drain electrode 7 is provided on the GaN plug 23, and an upper surface portion of the high concentration dopant layer 23a protrudes from one end on the gate electrode 9 side of the drain electrode 7 in plan view.

Figure 12C:
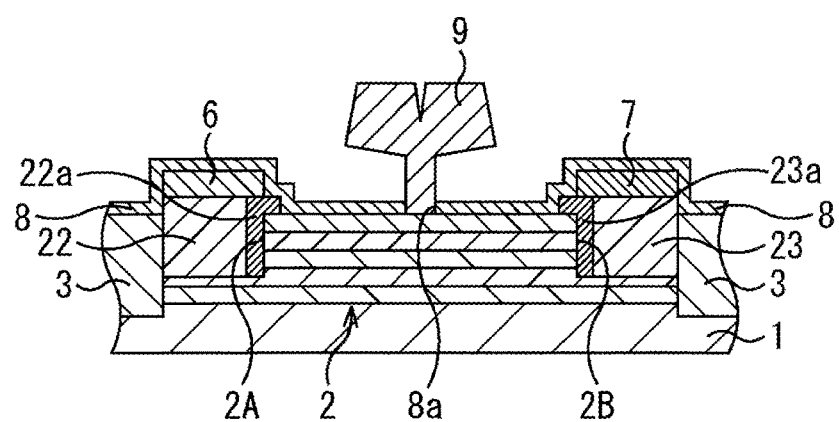

Subsequently, by performing steps similar to those of FIG. 3C to FIG. 5B according to the first embodiment, as illustrated in FIG. 12C, a gate electrode 9 is formed.

Thereafter, through steps of forming wires electrically connected to the source electrode 6, the drain electrode 7, and the gate electrode 9 and insulation films between layers as needed, an InAlGaN HEMT according to the second embodiment is formed.

Figure 13A:
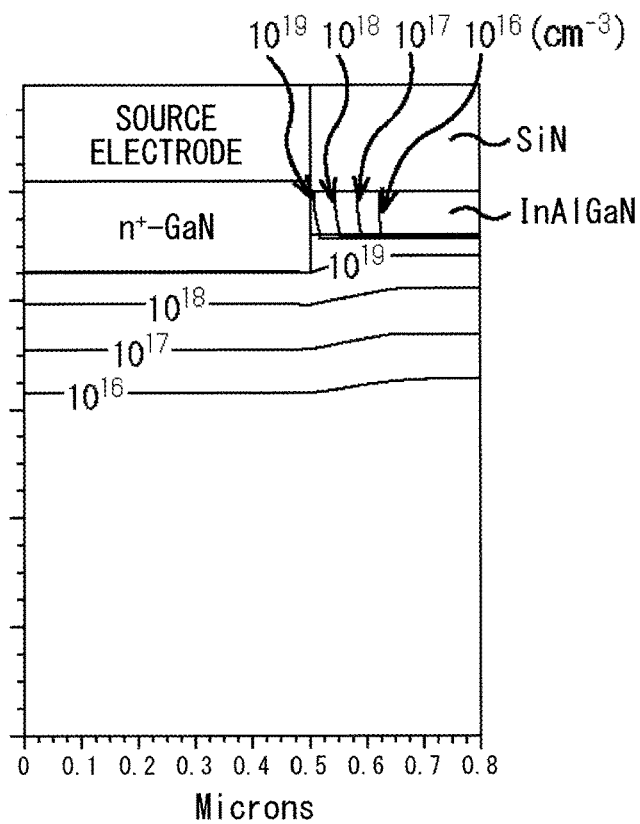
FIGS. 13A and 13B are characteristic diagrams illustrating calculation results, for the second embodiment and a comparative example, of carrier concentration distributions in InAlGaN HEMTs to which a selective regrown process is applied.
Figure 13B:
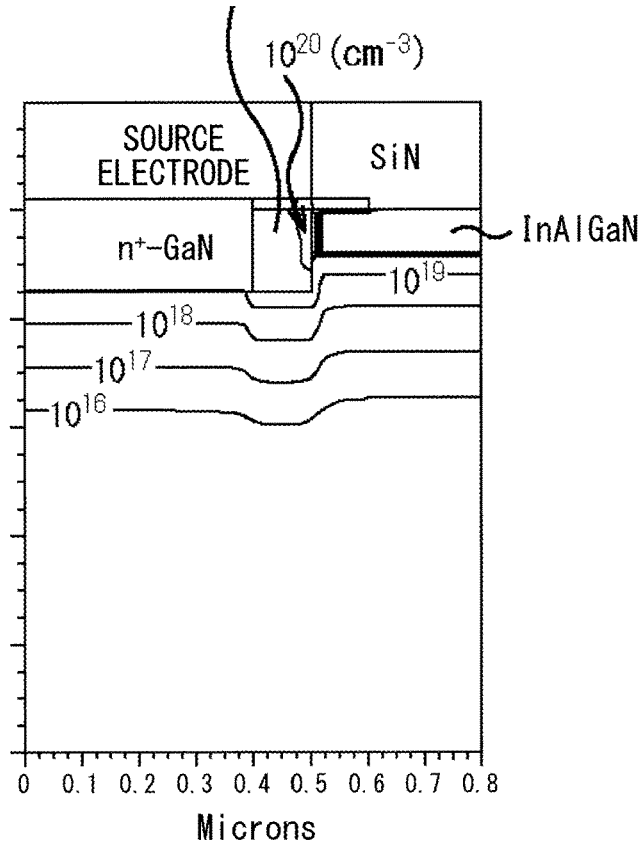

FIGS. 13A and 13B are characteristic diagrams illustrating calculation results, for the second embodiment and a comparative example, of carrier concentration distributions in InAlGaN HEMTs to which a selective regrown process is applied. FIG. 13A indicates a carrier concentration distribution in an ideal state in which a sufficient carrier concentration is ensured in the entire plug area without having a high concentration dopant layer (Comparative Example). FIG. 13B indicates a carrier concentration distribution of the second embodiment including a high concentration dopant layer. The unit of the carrier concentration is in $cm^{-3}$.

In FIG. 13A of the comparative example, the carrier concentration does not decrease in the GaN plug. In FIG. 13B of the second embodiment, it can be found that generation of a carrier concentration lowering area is sufficiently suppressed by forming a high concentration dopant layer. Therefore, an increase in ohmic contact resistance and ohmic contact resistivity caused by a decrease in carrier concentration due to airborne contaminants and bonding defects at the connection portions of the GaN plugs with the recess side walls of the compound semiconductor area at the time of regrowth is suppressed.

Figure 14A:
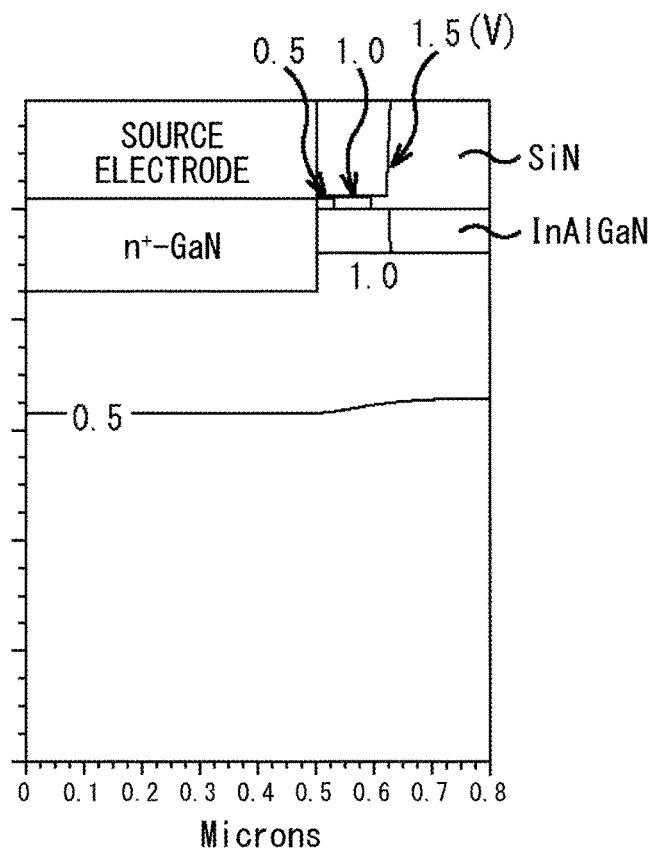
FIGS. 14A and 14B are characteristic diagrams illustrating calculation results, for the second embodiment and a comparative example, of potential distributions in InAlGaN HEMTs to which a selective regrown process is applied.
Figure 14B:
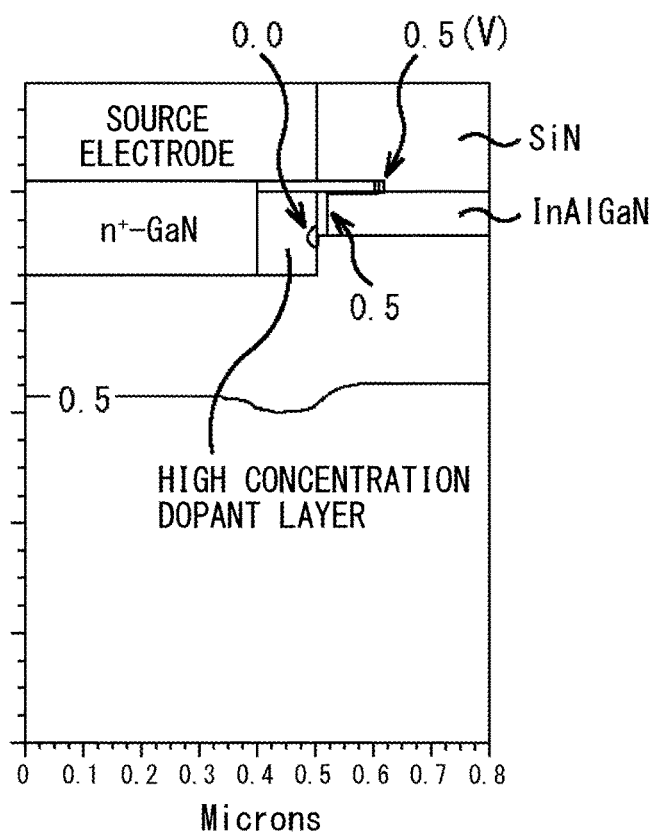

FIGS. 14A and 14B are characteristic diagrams illustrating calculation results, for the second embodiment and a comparative example, of potential distributions in InAlGaN HEMTs to which a selective regrown process is applied. FIG. 14A indicates a potential distribution in an ideal state in which a sufficient carrier concentration is ensured in the entire plug area without having a high concentration dopant layer (Comparative Example). FIG. 14B indicates a potential distribution of the second embodiment including a high concentration dopant layer. The unit of the potential is in V.

In FIG. 14A of the comparative example, a large potential gradient is present in the SiN film in the vicinity of the source electrode above the electron supply layer. This potential gradient, which is an electric field, possibly promotes a chemical reaction singly or mutually with respect to electrode materials, compound semiconductors, and an insulator. With respect to the above, in FIG. 14B of the second embodiment, it can be found that a large potential gradient in the SiN film is contained in the high concentration dopant layer present at a position aligned above the electron supply layer such that the large potential gradient does not leak into the surrounding insulation film. That is, the second embodiment has an effect of suppressing deterioration at a place where the above described chemical reaction easily occurs. Therefore, an increase in ohmic contact resistance and ohmic contact resistivity is suppressed as described above and deterioration of material structure quality in the vicinity of the ohmic electrodes is suppressed.

Figure 15A:
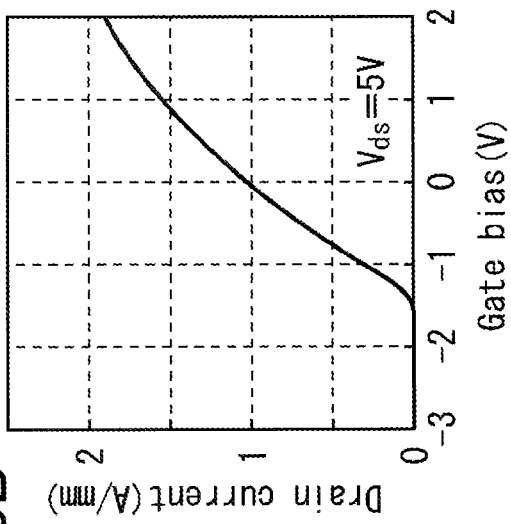
FIGS. 15A to 15D are characteristic diagrams illustrating electrical characteristics of the InAlGaN HEMT according to the second embodiment.
Figure 15B:
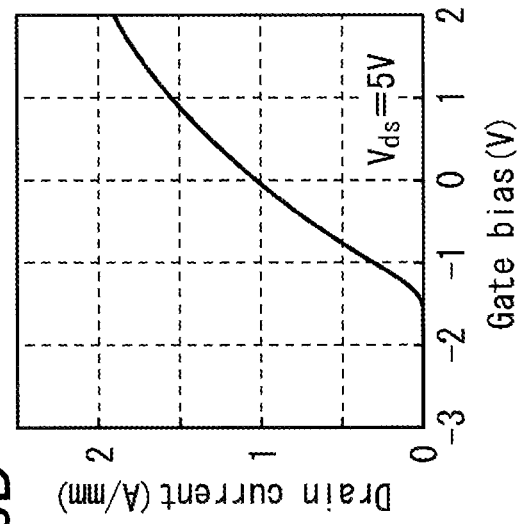
Figure 15C:
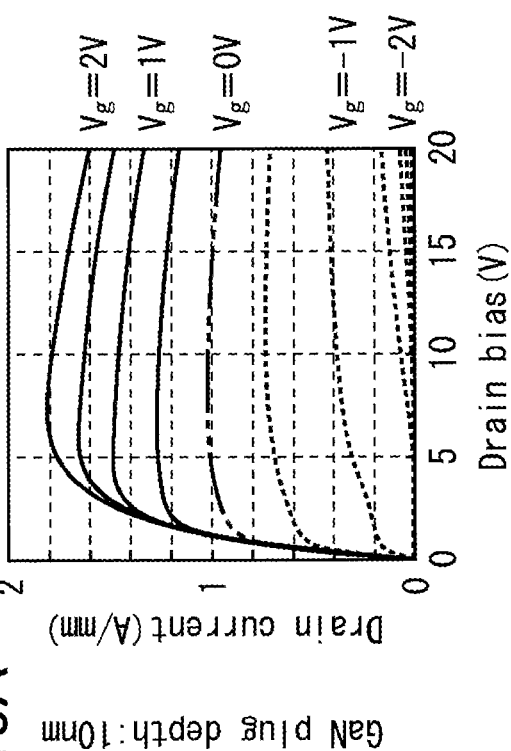
Figure 15D:
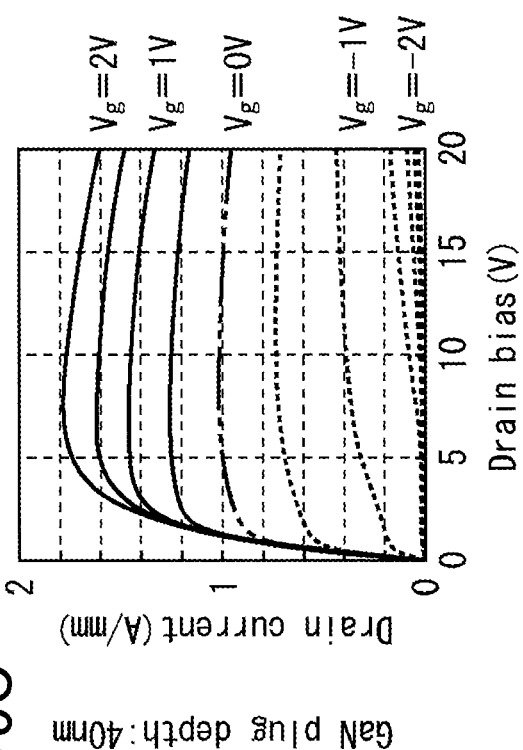

FIGS. 15A to 15D are characteristic diagrams illustrating electrical characteristics of the InAlGaN HEMT according to the second embodiment. FIGS. 15A and 15B indicate a case in which the depth (height) of the GaN plugs is 10 nm, and FIGS. 15C and 15D indicate a case in which the depth (height) of the GaN plugs is 40 nm. Each of FIGS. 15A and 15C indicates the relationship between the drain voltage and the drain current, and each of FIGS. 15B and 15D indicates the relationship between the gate voltage and the drain current. According to the second embodiment, it can be found that a low ON resistance and a large maximum drain current can be obtained, and electrical characteristics with no dependence on the structure of the GaN plugs can be obtained.

As described above, according to the second embodiment, it is possible to realize an InAlGaN HEMT suppressing generation of a carrier concentration lowering area in compound semiconductor plugs provided under a source electrode and a drain electrode and having a low dependence on the structure of the compound semiconductor plugs.

Variation Example

Here, a variation example of the second embodiment will be described. This variation example slightly differs from the first embodiment in high concentration dopant layers generated in GaN plugs.

Figure 16:
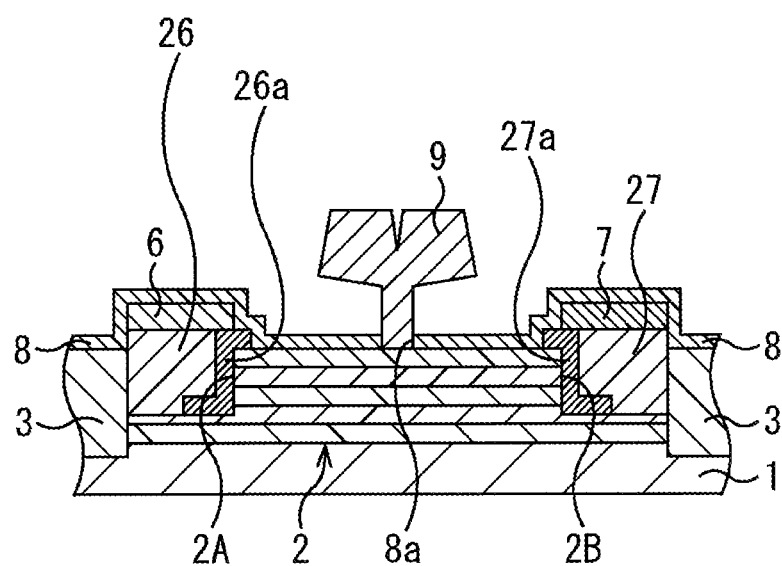
FIG. 16 is a schematic cross-sectional view illustrating a configuration of an InAlGaN HEMT according to a variation example of the second embodiment.

FIG. 16 is a schematic cross-sectional view illustrating a configuration of an InAlGaN HEMT according to the variation example of the second embodiment.

In this variation example, in the step of FIG. 11A, for example, using a plasma CVD method, $SiH_4$ and $NH_3$ gases are used as material gases under a Si-rich film formation condition such that SiN is formed to have a thickness of approximately 100 nm, for example. Thereby, the deposited insulation film, which is SiN here, is formed in a relatively low denseness state of containing SiH bonds or N—H bonds at a density of approximately $2 \times 10^{22}/cm^3$ or more. This SiN is rich in Si such that the refractive index is, for example, approximately 2.05 or more with respect to light having a wavelength of 633 nm. The insulation film may be formed by $SiO_2$ or SiON instead of SiN.

In the step of FIG. 11C, $n^+$—GaN is formed similarly to the second embodiment. The selective growth mask 12 is rich in Si such that the refractive index is, for example, approximately 2.05 or more with respect to light having a wavelength of 633 nm as described above. Therefore, Si is further supplied from the selective growth mask 12 into $n^+$—GaN by a heat process during the growth of $n^+$—GaN. Together with the side surface adjacent to the selective growth mask 12 of $n^+$—GaN, Si diffuses to a part of the bottom surface of the $n^+$—GaN 21, and high $n^+$—GaN whose Si concentration is higher than in the other parts of the $n^+$—GaN is formed.

Then, similar to the step of FIG. 12A, GaN plugs 26 and 27 are formed as illustrated in FIG. 16. The GaN plugs 26 and 27 include high concentration dopant layers 26a and 27a (made of high $n^+$—GaN) containing a dopant whose concentration is higher than that of the other portions (the portions made of n⁺—GaN) of the GaN plugs 26 and 27. The high concentration dopant layers 26a and 27a are formed on the side surface portions that are the interfaces with the compound semiconductor area 2 of the GaN plugs 26 and 27. According to the this example, the high concentration dopant layers 26a and 27a are formed in S shapes in a cross section such that their upper portions protrude from the side surface portions toward the inside of the compound semiconductor area 2 (toward the gate electrode 9) and their bottom portions protrude from the side surface portions toward the inside of the GaN plugs 26 and 27. Due to this shape, each of the high concentration dopant layers 26a and 27a partially overlaps the electron supply layer 2e in plan view.

As illustrated in FIG. 16, in the GaN plugs 26 and 27, the high concentration dopant layers 26a and 27a are formed integrally with the other portions. In the high concentration dopant layers 26a and 27a, the concentration of Si that is a dopant is set to, for example, be approximately $1 \times 10^{20}/\text{cm}^3$ or more. The concentration of Si of the high concentration dopant layers 26a and 27a is preferably approximately $1 \times 10^{21}/\text{cm}^3$ or more, and is more preferably approximately $1 \times 10^{22}/\text{cm}^3$ or more. When the concentration of Si of the high concentration dopant layers 26a and 27a is approximately $1 \times 10^{20}/\text{cm}^3$ or more (preferably approximately $1 \times 10^{21}/\text{cm}^3$ or more, and more preferably approximately $1 \times 10^{22}/\text{cm}^3$ or more), ohmic contact resistance can be sufficiently reduced. Because the high concentration dopant layers 26a and 27a are located at the interfaces with the sidewalls of the recesses 2A and 2B of the compound semiconductor area 2, the high concentration dopant layers 26a and 27a contain oxygen (O) or the like in airborne contaminants or the like as a dopant that differs from the dopant (Si) contained in the other portions of the GaN plugs 26 and 27.

The other steps are similar to those of the second embodiment.

According to the variation example, it is possible to realize an InAlGaN HEMT suppressing generation of a carrier concentration lowering area in compound semiconductor plugs provided under a source electrode and a drain electrode and having a low dependence on the structure of the compound semiconductor plugs.

Note that although the gate electrode 9 is formed in a T shape in the cross section in the gate length direction in each of the first and second embodiments and their variation examples, the gate electrode 9 is not limited to this. For example, a gate electrode whose cross-sectional shape is rectangular in the gate length direction may be formed.

Also, although the Schottky type InAlGaN HEMTs are described as examples in the first and second embodiments and their variation examples, the invention is not limited to these. For example, an MIS-type InAlGaN HEMT having a gate insulation film between an electron supply layer 2e and a gate electrode 9 may be produced. For example, a protective film 8 having an appropriate thickness may be used as the gate insulation film without forming an opening in the protective film 8. As the gate insulation film, oxide, nitride, or oxynitride of Si, Al, Hf, Zr, Ti, Ta or W is preferably selected or two or more of these are preferably selected to be deposited in multi layers.

Third Embodiment

A power-supply device according to a third embodiment to which one InAlGaN HEMT selected from the first and second embodiments and their variation examples will be described.

Figure 17:
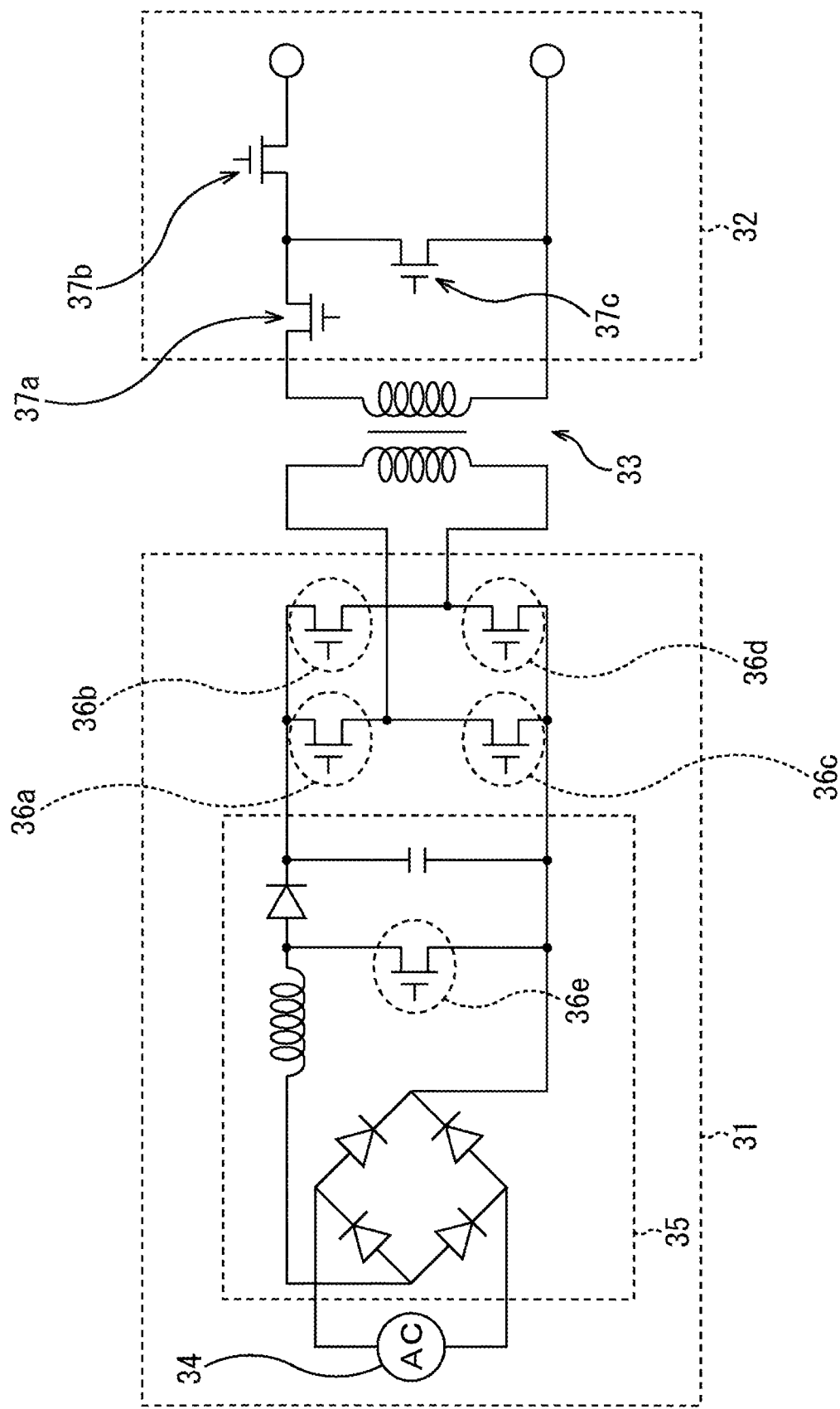
FIG. 17 is a wiring diagram illustrating a schematic configuration of a power-supply device according to a third embodiment.

FIG. 17 is a wiring diagram illustrating a schematic configuration of the power-supply device according to the third embodiment.

The power-supply device includes a high-voltage primary circuit 31, a low-voltage secondary circuit 32, and a transformer 33 disposed between the primary circuit 31 and the secondary circuit 32.

The primary circuit 31 includes an alternating-current power supply 34, a bridge rectifier circuit 35, and multiple (four in the third embodiment) switching elements 36a, 36b, 36c, and 36d. Also, the bridge rectifier circuit 35 includes a switching element 36e.

The secondary circuit 32 includes multiple (three in the third embodiment) switching elements 37a, 37b, and 37c.

In the third embodiment, the switching elements 36a, 36b, 36c, 36d, and 36e of the primary circuit 51 are implemented by one InAlGaN HEMT selected from the first and second embodiments and their variation examples. The switching elements 37a, 37b, and 37c of the secondary circuit 32 are implemented by normal MIS-FETs using silicon.

To the power-supply device according to the third embodiment, an InAlGaN HEMT suppressing generation of a carrier concentration lowering area in compound semiconductor plugs provided under a source electrode and a drain electrode and having a low dependence on the structure of the compound semiconductor plugs is applied. As a result, the high power power-supply device is highly reliable.

Fourth Embodiment

A high-frequency amplifier according to a fourth embodiment to which one InAlGaN HEMT selected from the first and second embodiments and their variation examples will be described.

Figure 18:
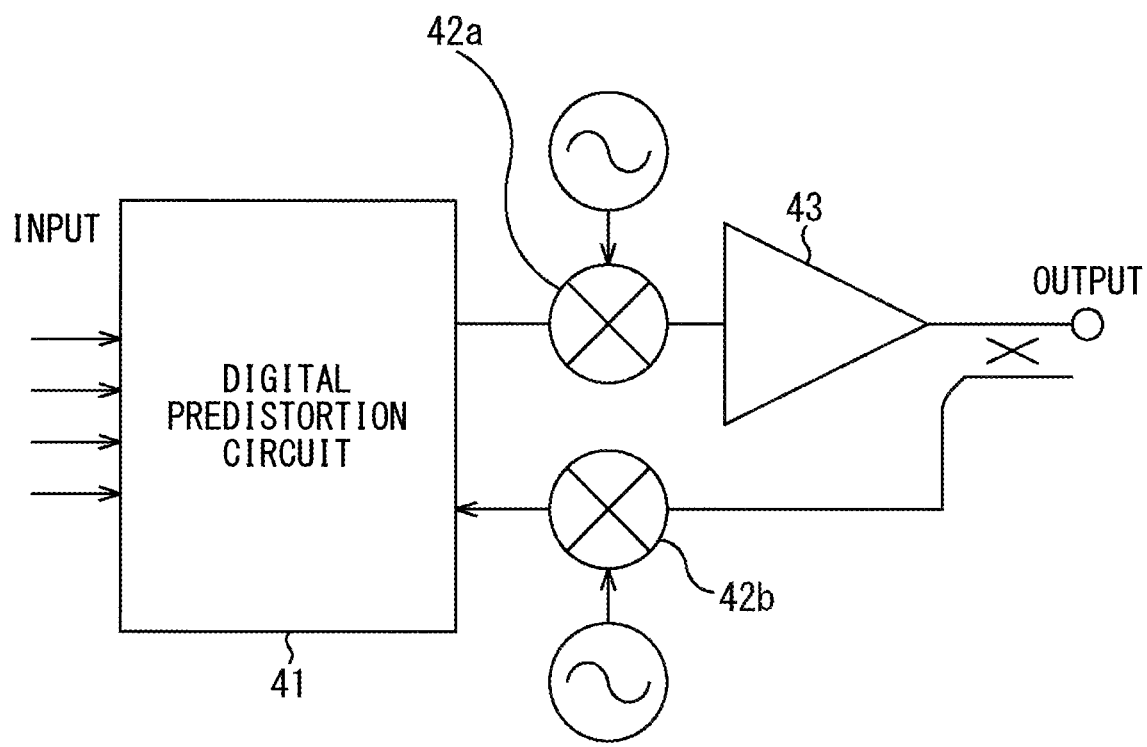
FIG. 18 is a wiring diagram illustrating a schematic configuration of a high-frequency amplifier according to a fourth embodiment.

FIG. 18 is a wiring diagram illustrating a schematic configuration of the high-frequency amplifier according to the fourth embodiment.

The high-frequency amplifier according to the fourth embodiment includes a digital predistortion circuit 41, mixers 42a and 42b, and a power amplifier 43.

The digital predistortion circuit 41 compensates for non-linear distortion with respect to an input signal. The mixer 42a mixes the input signal of which the non-linear distortion was compensated with an AC signal. The power amplifier amplifies the input signal mixed with the AC signal and includes one InAlGaN HEMT selected from the first and second embodiments and their variation examples. Note that the high-frequency amplifier illustrated in FIG. 18 can, in accordance with a switching operation, for example, mix an output-side signal with an AC signal using the mixer 42b, and can send the mixed signal to the digital predistortion circuit 41.

To the high-frequency amplifier according to the fourth embodiment, an InAlGaN HEMT suppressing generation of a carrier concentration lowering area in compound semiconductor plugs provided under a source electrode and a drain electrode and having a low dependence on the structure of the compound semiconductor plugs is applied. Thereby, the high-frequency amplifier is highly reliable and has a high pressure resistance.

An embodiment may be implemented as follows, for example.

A power-supply device according to an embodiment includes: a high-voltage circuit that includes a transistor; a low-voltage circuit; and a transformer disposed between the high-voltage circuit and the low-voltage circuit, wherein the transistor includes a compound semiconductor area in which a compound semiconductor plug is embedded and formed; and an ohmic electrode provided on the compound semiconductor plug, and wherein the compound semiconductor plug includes, in a side surface portion that is as an interface with the compound semiconductor area, a high concentration dopant layer containing a dopant whose concentration is higher than that of other portions.

According to an embodiment, a high-frequency amplifier for amplifying an input high-frequency voltage to output the amplified voltage, the high-frequency amplifier including: a transistor, wherein the transistor includes a compound semiconductor area in which a compound semiconductor plug is embedded and formed; and an ohmic electrode provided on the compound semiconductor plug, and wherein the compound semiconductor plug includes, in a side surface portion that is as an interface with the compound semiconductor area, a high concentration dopant layer containing a dopant whose concentration is higher than that of other portions.

All examples and conditional language provided herein are intended for pedagogical purposes of aiding the reader in understanding the invention and the concepts contributed by the inventors to further the art, and are not to be construed as limitation to such specifically recited examples and conditions, nor does the organization of such examples in the specification relate to a showing of superiority and inferiority of the invention. Although one or more embodiments of the present invention have been described in detail, it should be understood that various changes, substitutions, and alterations could be made hereto without departing from the spirit and scope of the invention.

What is claimed is:

1. A compound semiconductor device comprising:
   a compound semiconductor area in which a compound semiconductor plug is embedded and formed; and
   an ohmic electrode provided on the compound semiconductor plug,
   the compound semiconductor plug includes, in a side surface portion that is as an interface with the compound semiconductor area, a high concentration dopant layer containing a dopant whose concentration is higher than a concentration of a dopant of other portions in the compound semiconductor plug, and
   the concentration of the dopant of the high concentration dopant layer is greater than or equal to $1 \times 10^{20}/cm^3$.

2. The compound semiconductor device according to claim 1, wherein an upper portion of the high concentration dopant layer protrudes from the side surface portion toward inside of the compound semiconductor area.

3. The compound semiconductor device according to claim 1, wherein a bottom portion of the high concentration dopant layer protrudes from the side surface portion toward inside of the compound semiconductor plug.

4. The compound semiconductor device according to claim 1, wherein the concentration of the dopant of the high concentration dopant layer is greater than or equal to $1 \times 10^{21}/cm^3$.

5. The compound semiconductor device according to claim 1, wherein the concentration of the dopant of the high concentration dopant layer is greater than or equal to $1 \times 10^{22}/cm^3$.

6. The compound semiconductor device according to claim 1, wherein, in the compound semiconductor plug, the high concentration dopant layer is formed integrally with said other portions in the compound semiconductor plug.

7. The compound semiconductor device according to claim 1, wherein the high concentration dopant layer contains a dopant that is not contained in said other portions in the compound semiconductor plug.

8. The compound semiconductor device according to claim 1
   wherein the compound semiconductor area includes an electron supply layer, and
   wherein the electron supply layer contains one type of compound selected from InAlGaN, InAlN, AlGaN, and AlN.

9. A method for producing a compound semiconductor device, the method comprising:
   embedding and forming, in a compound semiconductor area, a compound semiconductor plug including, in a side surface portion that is as an interface with the compound semiconductor area, a high concentration dopant layer containing a dopant whose concentration is higher than a concentration of a dopant of other portions in the compound semiconductor plug; and
   forming an ohmic electrode on the compound semiconductor plug,
   the concentration of the dopant of the high concentration dopant layer is greater than or equal to $1 \times 10^{20}/cm^3$.

10. The method for producing the compound semiconductor device according to claim 9, the method further comprising:
    forming a silicon insulation film on the compound semiconductor area before forming the compound semiconductor plug,
    wherein the compound semiconductor plug is formed such that the silicon insulation film contacts the high concentration dopant layer.

11. The method for producing the compound semiconductor device according to claim 10, wherein the silicon insulation film has a refractive index of 2.05 or more with respect to light having a wavelength of 633 nm.

12. The method for producing the compound semiconductor device according to claim 9, wherein an upper portion of the high concentration dopant layer protrudes from the side surface portion toward inside of the compound semiconductor area.

13. The method for producing the compound semiconductor device according to claim 9, wherein a bottom portion of the high concentration dopant layer protrudes from the side surface portion toward inside of the compound semiconductor plug.

14. The method for producing the compound semiconductor device according to claim 9, wherein the concentration of the dopant of the high concentration dopant layer is greater than or equal to $1 \times 10^{21}/cm^3$.

15. The method for producing the compound semiconductor device according to claim 9, wherein the concentration of the dopant of the high concentration dopant layer is greater than or equal to $1 \times 10^{22}/cm^3$.

16. The method for producing the compound semiconductor device according to claim 9, wherein, in the compound semiconductor plug, the high concentration dopant layer is formed integrally with said other portions in the compound semiconductor plug.

17. The method for producing the compound semiconductor device according to claim 9, wherein the high concentration dopant layer contains a dopant that is not contained in said other portions in the compound semiconductor plug.

18. The method for producing the compound semiconductor device according to claim 9,
    wherein the compound semiconductor area includes an electron supply layer, and wherein the electron supply layer contains one type of compound selected from InAlGaN, InAlN, AlGaN, and AlN.

\* \* \* \* \*